(12) United States Patent
Ahmed

(10) Patent No.: US 7,596,184 B2
(45) Date of Patent: Sep. 29, 2009

(54) APPARATUS, SYSTEM, AND METHOD FOR AMPLITUDE-PHASE SYNCHRONIZATION IN POLAR TRANSMITTER

(75) Inventor: Walid Khairy Mohamed Ahmed, Tinton Falls, NJ (US)

(73) Assignee: Pine Valley Investments, Inc., Las Vegas, NV (US)

( * ) Notice: Subject to any disclaimer, the term of this patent is extended or adjusted under 35 U.S.C. 154(b) by 510 days.

(21) Appl. No.: 11/396,122

(22) Filed: Mar. 30, 2006

(65) Prior Publication Data

US 2007/0230612 A1 Oct. 4, 2007

(51) Int. Cl.
H04K 1/02 (2006.01)
(52) U.S. Cl. ...................................... 375/296
(58) Field of Classification Search ................. 375/295, 375/296, 297, 376, 300; 455/127.1, 126, 455/116, 108, 102; 332/103; 330/149, 136
See application file for complete search history.

(56) References Cited

U.S. PATENT DOCUMENTS

| | | | |
|---|---|---|---|
| 4,630,315 | A | 12/1986 | Watkinson |
| 6,043,707 | A | 3/2000 | Budnik |
| 6,101,224 | A | 8/2000 | Lindoff et al. |
| 6,141,390 | A | 10/2000 | Cova |
| 6,445,249 | B1 | 9/2002 | Khan et al. |
| 6,701,134 | B1 | 3/2004 | Epperson |
| 6,834,084 | B2 | 12/2004 | Hietala |
| 6,844,788 | B2 | 1/2005 | Chadwick |
| 2002/0090921 | A1 | 7/2002 | Midtgaard et al. |
| 2002/0196864 | A1 | 12/2002 | Booth et al. |
| 2003/0073419 | A1 | 4/2003 | Chadwick |
| 2003/0215025 | A1 | 11/2003 | Hietala |
| 2003/0215026 | A1 | 11/2003 | Hietala |
| 2004/0192369 | A1 | 9/2004 | Nilsson |
| 2004/0198257 | A1 | 10/2004 | Takano et al. |
| 2004/0208157 | A1 | 10/2004 | Sander et al. |
| 2004/0212445 | A1 | 10/2004 | Haglan |
| 2004/0219891 | A1 | 11/2004 | Hadjichristos |
| 2004/0263245 | A1 | 12/2004 | Winter et al. |
| 2005/0064830 | A1 | 3/2005 | Grigore |
| 2005/0110565 | A1 | 5/2005 | Robinson |
| 2005/0110568 | A1 | 5/2005 | Robinson et al. |
| 2005/0122164 | A1 | 6/2005 | Brandt et al. |
| 2005/0134396 | A1 | 6/2005 | Pehlke et al. |
| 2005/0190854 | A1 | 9/2005 | Shakeshaft et al. |
| 2005/0191976 | A1 | 9/2005 | Shakeshaft et al. |
| 2005/0245208 | A1 | 11/2005 | Udagawa et al. |
| 2006/0067427 | A1* | 3/2006 | Zolfaghari et al. .......... 375/297 |
| 2007/0142005 | A1* | 6/2007 | Sundstrom ................... 455/126 |

(Continued)

FOREIGN PATENT DOCUMENTS

WO WO 00/35080 6/2000

OTHER PUBLICATIONS

Walid K.M. Ahmend and P.J. McLane, "A Method for Coarse Frequency Acquisition for Nyquist Filtered MPSK", IEEE Transactions on Vehicular Technology, Nov. 1996, vol. 45, No. 4, pp. 720-731.

* cited by examiner

Primary Examiner—Kevin Y Kim
(74) Attorney, Agent, or Firm—Allen, Dyer, Doppelt, Milbrath & Gilchrist, P.A.

(57) ABSTRACT

A modulation path synchronization apparatus in a polar transmitter includes a modulation path to receive a training waveform, a detector coupled to the modulation path, and a processor coupled to the detector. The detector is to detect a modulated training waveform. The processor is to determine a delay between the training waveform and the modulated training waveform.

20 Claims, 12 Drawing Sheets

APPARATUS, SYSTEM, AND METHOD FOR AMPLITUDE-PHASE SYNCHRONIZATION IN POLAR TRANSMITTER

BACKGROUND

Polar modulation is a technique whereby a signal, or carrier, having constant radian frequency ω, is time-varied in both magnitude and phase. Polar modulation transmitters transmit information that both the magnitude (R) and the phase (θ) of a signal simultaneously carry. There are many benefits to using polar modulation to transmit information. Polar transmitters receive baseband signals represented in Cartesian form as an in-phase (I) component and a quadrature (Q) component. The I/Q baseband signals are naturally symmetric at the source. The I/Q baseband signals are converted to polar form in terms of its magnitude R and phase θ signals. The magnitude R is referred to as the amplitude signal and the phase θ is referred to as the phase signal. A coordinate rotation digital computer (CORDIC) algorithm may be employed to convert the I/Q baseband signals to polar form amplitude R and phase θ signals. The amplitude R and phase θ signals are processed in separate amplitude and phase paths and may be recombined at the output of the power amplifier. The I/Q components may be reconstructed by additional processing downstream of the power amplifier output.

Circuits for processing the amplitude R and phase θ signals in the respective separate amplitude and phase paths are substantially different and may lead to timing misalignments between the amplitude and phase signals. Unlike the natural symmetry of the I/Q baseband signals at the source, the amplitude R and phase θ signals are asymmetric, and thus, there are timing misalignments between them. The timing misalignment between these signals is detrimental to the reconstructed I/Q component. Accordingly, in polar transmitters, there is a need to synchronize the amplitude R and phase θ signals to correct for the timing misalignments due to different delays encountered by these signals in the separate amplitude R and phase θ processing paths. Therefore, there is a need for techniques to determine and correct for delays in the amplitude R and phase θ processing paths. There is a need to estimate and correct for these timing misalignments in an accurate manner.

SUMMARY

In one embodiment, a modulation path synchronization apparatus in a polar transmitter includes a modulation path to receive a training waveform, a detector coupled to the modulation path, the detector to detect a modulated training waveform, and a processor coupled to the detector, the processor to determine a delay between the training waveform and the modulated training waveform.

In one embodiment, a method to synchronize modulation paths in a polar transmitter includes passing a baseband amplitude training waveform in an amplitude modulation path; detecting a carrier envelope of a first amplitude modulated training waveform associated with the amplitude training waveform; and determining an amplitude modulation path delay.

In one embodiment, a system to synchronize modulation paths in a polar transmitter includes an amplifier and a modulation path coupled to the amplifier to receive a training waveform, a detector coupled to the modulation path, the detector to detect a modulated training waveform, and a processor coupled to the detector, the processor to determine a delay between the training waveform and the modulated training waveform.

DETAILED DESCRIPTION

Figure 1:
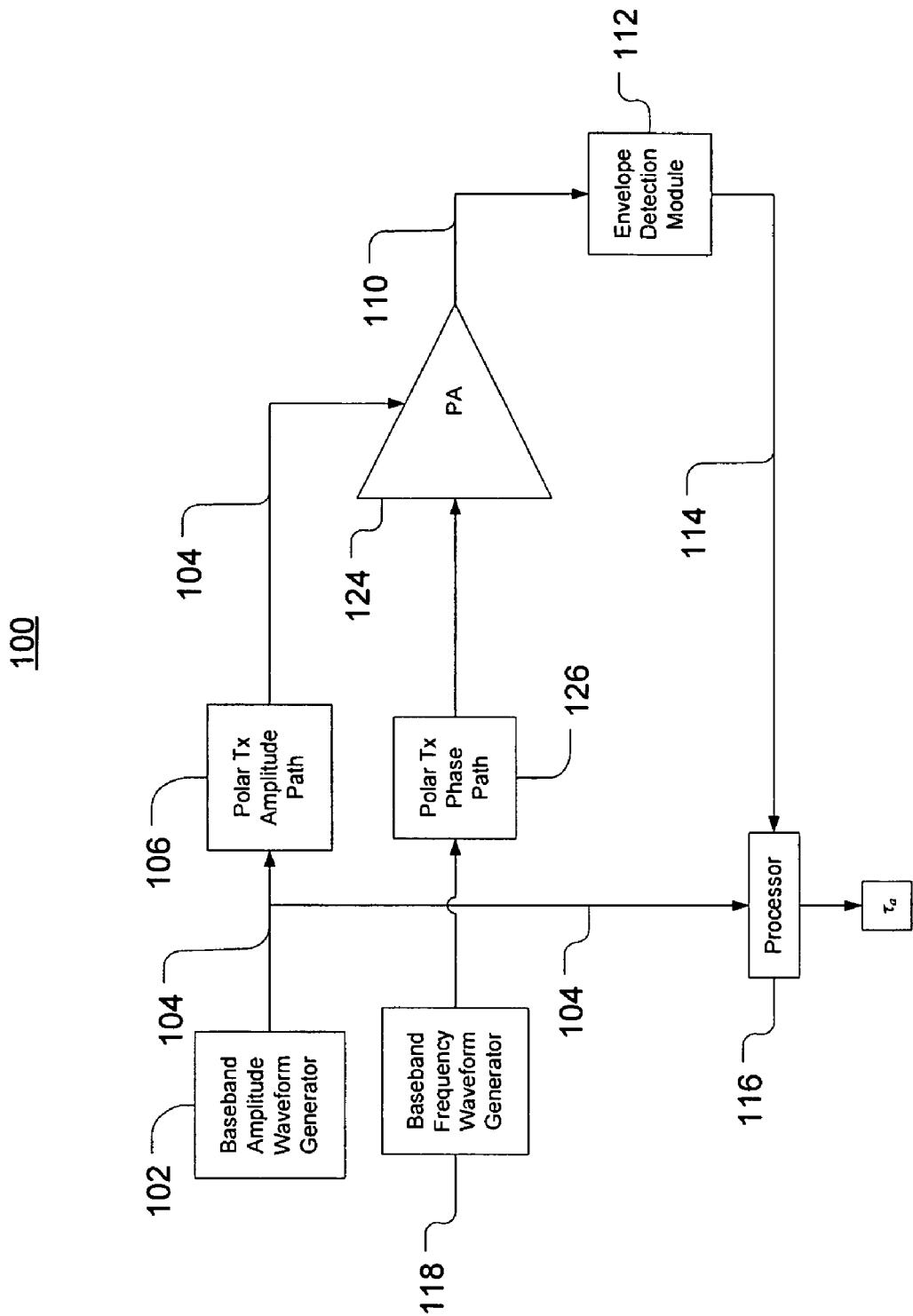
FIG. 1 illustrates one embodiment of an amplitude modulation path synchronization system.

Embodiments of various implementations of a path delay estimation techniques to estimate and correct timing misalignments between amplitude and phase processing paths in a polar modulation topology transmitter are disclosed and claimed. Polar domain amplitude R and phase θ signal representations of I/Q baseband signals are employed to accurately estimate and correct amplitude and phase path timing misalignments (delay mismatches). These techniques may be integrated with circuits and modules in polar transmitter integrated circuit (IC) devices.

In one embodiment, a path delay estimation system calculates estimated amplitude modulation path delay and phase modulation path delay in separate steps (two-step method). In a first step, the system may estimate amplitude modulation path training mode and, in a second step, the system may estimate the phase modulation path delay. It will be appreciated that the order of the first and second steps may be reversed without limitation. In one embodiment, a path delay estimation system calculates estimated amplitude and phase modulation path delays in single-step or two-step method. In one embodiment, a path delay estimation system calculates estimated amplitude and phase modulation path delays simultaneously. In various embodiments, training waveforms may be passed through each amplitude and phase modulation paths simultaneously during the synchronization training period. Accordingly, amplitude and phase training waveforms are passed through respective amplitude and phase paths simultaneously. In the two-step method, input training waveforms are passed through the amplitude and phase paths of the polar transmitter separately. The estimated delay in each path is also obtained separately. The input training waveforms comprise a periodic waveform at a predetermined frequency, amplitude, and shape or form. The input training waveforms are amplitude-modulated (AM) or frequency-modulated (FM) at the power amplifier (PA) with a carrier waveform based on whether the path delay estimation system is operating in amplitude training mode or phase training mode, respectively. The carrier waveform comprises a periodic waveform at a much higher frequency than the input training waveform. At the output of the PA, the AM or FM training waveforms are detected and correlated with the respective input training waveform to estimate a delay for the respective amplitude or phase path. Detection and correlation techniques may differ based on whether the path delay estimation system is in amplitude path training mode or phase modulation path training mode. In one embodiment, the training waveform may be a sine wave at a frequency referred to as a tone. Although a "sine wave tone" may be referred to herein, it is to be understood that a sine wave tone is used merely to simplify the description. The embodiments are in no way intended to be limited to any particular waveform shape, magnitude, or frequency. Any waveform and/or frequency may be used to generate the training waveforms, carrier waveforms, modulation waveforms, and the like.

In the two-step method, each of the amplitude and phase modulation path delays are determined separately. In amplitude modulation path training mode, the input training waveform is an amplitude training waveform. The amplitude training waveform is driven through the amplitude path of the polar transmitter while no signal or waveform is driven through the phase path. The amplitude training waveform is amplified by the PA and amplitude modulated with a carrier waveform. The envelope of the amplified amplitude modulated training waveform is detected at the output of the PA. The detected envelope is correlated with the input amplitude training waveform to estimate the amplitude modulation path delay.

In phase modulation path training mode, the input training waveform is a frequency training waveform. The frequency training waveform is driven through the phase path of the polar transmitter while no signal or waveform is driven through the amplitude path. The frequency training waveform is frequency modulated at the PA with the carrier waveform. Accordingly, the output of the PA is a FM training waveform. In the phase modulation path training mode, prior to envelope detection, the FM training waveform may first be converted from an FM waveform to an AM waveform by an FM-to-AM converter. In one embodiment, the FM-to-AM converter may be implemented as a low pass filter (LPF). The FM-to-AM conversion module converts the output FM waveform (the first derivative of the phase signal) comprising frequency variations to an AM waveform comprising amplitude variations. An AM detector (e.g., envelope detector or a synchronous detector) is used to detect the envelope or amplitude variations in the AM waveform. The envelope of the AM waveform is correlated with the input frequency training waveform to estimate the phase modulation path delay.

In one embodiment, the path delay estimation system may calculate estimated amplitude and phase modulation path delays simultaneously (single-step method). Accordingly, amplitude and phase training waveforms are passed through respective amplitude and phase paths simultaneously. The output of the PA is down-converted with a local oscillator (LO) signal. A CORDIC process extracts amplitude and phase components, which are correlated with the respective input training waveforms to estimate the delays.

The baseband amplitude and frequency training waveforms used for the respective amplitude and phase modulation path delay estimations can be any suitable waveforms with satisfactory sensitivity to synchronization errors. For example, the baseband amplitude and frequency training waveforms may be Walsh codes or the likes, such as those on code division multiple access (CDMA) synchronization channels (e.g., in wideband code division multiple access or WCDMA) can be used. In one embodiment, the input training waveforms may be digitized waveforms generated by a digital waveform generator. In one embodiment, the input training waveforms may be in the form of a sine wave characterized by a frequency and amplitude. The embodiments, however, are not limited in this context as any periodic waveform may be used as a training waveform for delay estimation purposes.

In one embodiment, where an FM-to-AM converter is employed at the output of the PA to convert the FM waveform to an AM waveform, the FM-to-AM converter may comprise a negligible group delay or a delay that may be accurately ascertained with high certainty. For example, in embodiments where the FM-to-AM converter is implemented as a low-order LPF with bandwidth (BW) equal to half the carrier frequency, the group delay generally will be very small around the carrier frequency zone (e.g., on the order of picoseconds), and thus may be negligible relative to the amplitude or phase modulation path delays.

In one embodiment, the dynamic range of the baseband frequency training waveform may be selected to be as small as possible to maintain linearity of the FM-to-AM converter transfer function (i.e., to have a relatively small frequency-modulation depth). A low-frequency amplifier can be used to amplify the detected envelope of the AM waveform from the FM waveform if needed. Otherwise, an analog-to-digital converter (ADC) with sufficient bit-width may be employed at the output of the envelope detection module to obtain adequate numerical resolution. Then, for example, the mean of the detected envelope can be subtracted from the detected envelope and the difference can be numerically magnified (digital gain).

FIG. 1 illustrates one embodiment of an amplitude modulation path synchronization system 100. System 100 may be implemented in a RF polar modulation transmitter topology. During an amplitude modulation path 106 synchronization training period, system 100 estimates delay $\tau_\alpha$ in amplitude modulation path 106. Delay $\tau_\alpha$ is the time it takes an amplitude training waveform to propagate through amplitude modulation path 106. System 100 uses estimated delay $\tau_\alpha$ to synchronize amplitude modulation path 106 delays with phase modulation path 126 delays. Synchronization system 100 comprises baseband amplitude waveform generator 102 to generate baseband amplitude training waveform 104. During the synchronization training period, amplitude training waveform 104 is passed through amplitude modulation path 106 of the polar transmitter. Amplitude training waveform 104 is delayed by $\tau_\alpha$ seconds as it propagates through amplitude modulation path 106. Amplitude training waveform 104 is received at an amplitude modulation node of PA 124. Amplitude training waveform 104 is amplitude modulated with a RF carrier waveform at PA 124 to produce AM training waveform 110 at an output node of PA 124. AM training waveform 110 comprises an envelope formed by the RF carrier waveform with the amplitude variations proportional to amplitude training waveform 104. Envelope detection module 112 detects the envelope of the RF carrier waveform of AM training waveform 110. Processor 116 receives detected envelope waveform 114. Processor 116 correlates detected envelope waveform 114 with amplitude training waveform 104 and estimates the amplitude modulation path 106 delay $\tau_\alpha$ between these two waveforms. In one embodiment, processor 116 estimates the amplitude modulation path 106 delay $\tau_\alpha$ by normalizing the detected envelope waveform 114 and performing a slide-and-correlate process. Amplitude modulation path 106 delay $\tau_\alpha$ may be recorded and/or stored in memory. To synchronize amplitude modulation path 106 with phase modulation path 126, the delay mismatch ($\tau_\alpha-\tau_\phi$), where $\tau_\phi$ is the phase path time delay, is determined by way of calculation. (Determining the phase path delay $\tau_\phi$ is described below with reference to FIG. 2.) As previously discussed, in this embodiment, the time delay estimates in each of amplitude modulation path 106 and phase modulation path 126 are done separately. Therefore, during the amplitude modulation path 106 synchronization training period, baseband frequency waveform generator 118 is turned off and does not generate baseband frequency training waveform 202. Therefore, there are no baseband frequency training waveforms 202 in phase modulation path 126 during the amplitude modulation path 106 synchronization training period.

Figure 2:
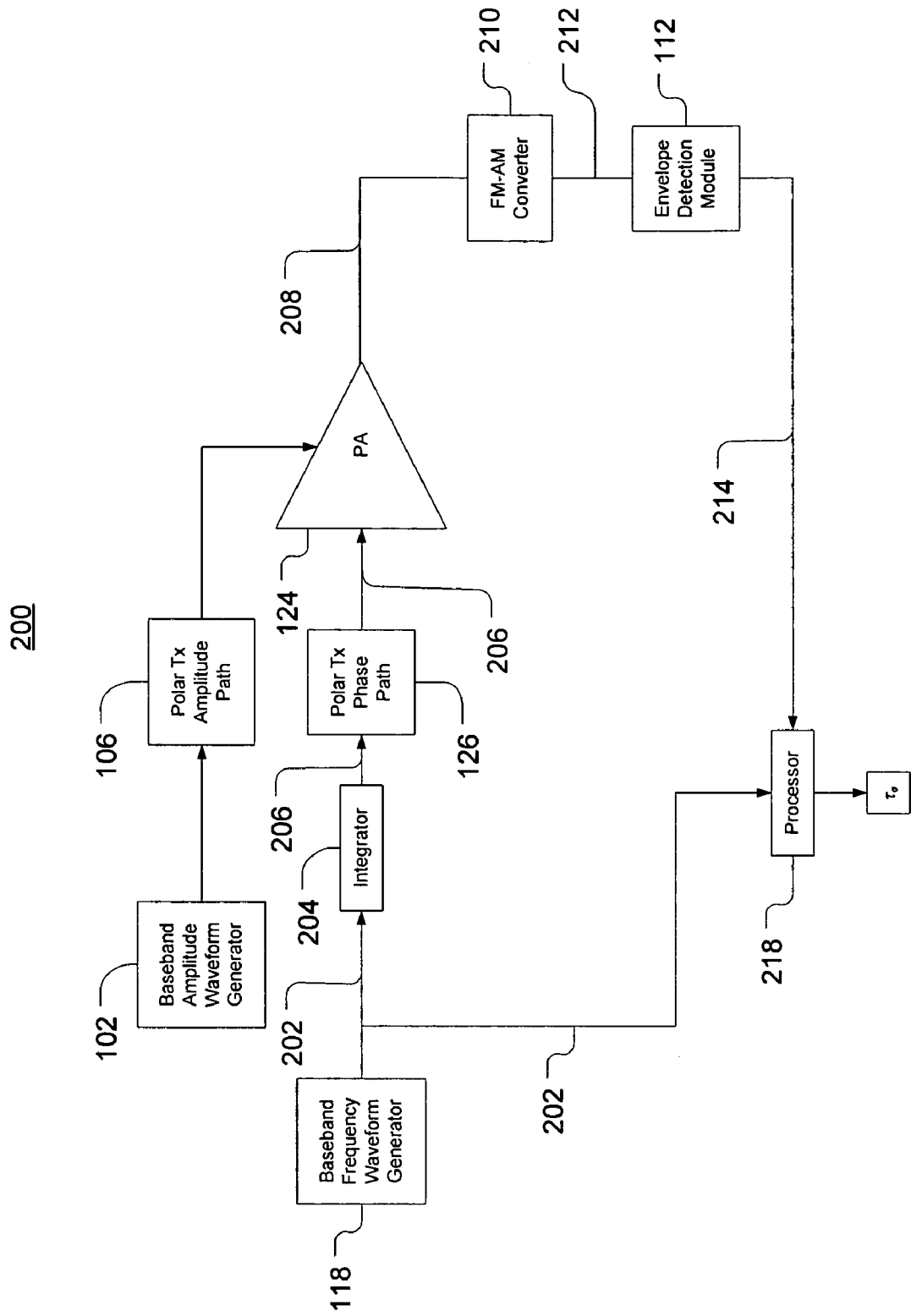
FIG. 2 illustrates one embodiment of a phase modulation path delay synchronization system.

FIG. 2 illustrates one embodiment of a phase modulation path delay synchronization system 200. System 200 may be implemented in a RF polar modulation transmitter topology. During a phase modulation path 126 synchronization training period, system 200 estimates delay $\tau_\phi$ in phase modulation path 126. Delay $\tau_\phi$ is the time it takes a frequency training waveform to propagate through amplitude modulation path 126. System 200 uses estimated delay $\tau_\phi$ to synchronize phase modulation path 126 delays with amplitude modulation path 106 delays. Synchronization system 200 comprises baseband frequency waveform generator 118 to generate baseband frequency training waveform 202. During the synchronization training period, frequency training waveform 202 is passed through phase modulation path 126 of the polar transmitter. Frequency training waveform 202 may be integrated by integrator 204, which produces an integrated frequency training waveform 206. Integrated frequency training waveform 202 is passed through polar transmitter phase modulation path 126. Frequency training waveform 206 is delayed by $\tau_\phi$ seconds as it propagates through phase modulation path 126. Frequency training waveform 206 is received at an input node of PA 124. Frequency training waveform 206 frequency modulated with a RF carrier waveform of PA 124 to produce FM training waveform 208 at an output node of PA 124. FM training waveform 208 comprises an envelope formed by the RF carrier waveform with frequency variations proportional to frequency training waveform 202. FM-to-AM converter 210 converts FM training waveform 208 to AM training waveform 212. In various embodiments, FM-to-AM converter 210 may be implemented as a LPF or an FM slope-detector demodulator, for example. Envelope detection module 112 detects the envelope of the RF carrier waveform of AM training waveform 212. Processor 218 correlates detected envelope training waveform 214 with frequency training waveform 202 and estimates the phase modulation path 126 delay $\tau_\phi$ between these two waveforms. In one embodiment, processor 218 estimates the phase modulation path 126 delay $\tau_\phi$ by normalizing the detected envelope waveform 214 and performing a slide-and-correlate process. Phase modulation path 126 delay $\tau_\phi$ may be recorded and/or stored n memory. To synchronize phase modulation path 126 with amplitude modulation path 106, the delay mismatch ($\tau_\alpha-\tau_\phi$), where $\tau_\alpha$ is the amplitude path time delay, is determined by way of calculation. (Determining the amplitude path delay $\tau_\alpha$ is described with reference to FIG. 1.) As previously discussed, in this embodiment, the time delay estimates in each of amplitude modulation path 106 and phase modulation path 126 are done separately. Therefore, during the phase modulation path 126 synchronization training period, baseband amplitude waveform generator 102 is turned off and does not generate baseband amplitude training waveform 104. Therefore, there are no baseband amplitude training waveforms 104 in amplitude modulation path 106 during the phase modulation path 126 synchronization training period.

Figure 3A:
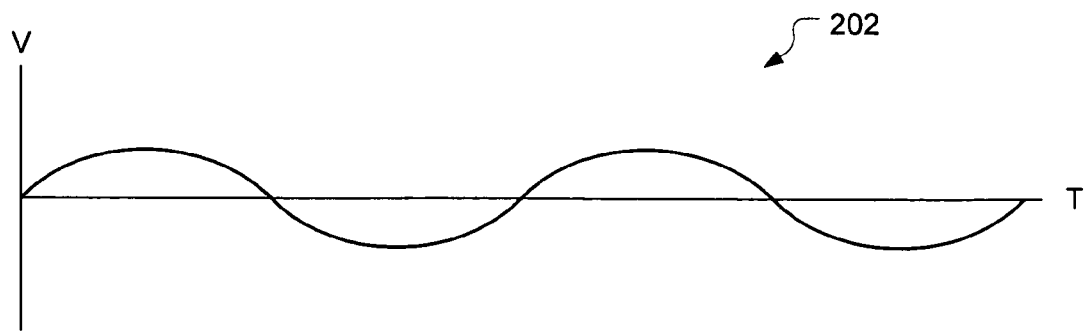
FIGS. 3A, B, C, D graphically illustrates various embodiments of waveforms in a phase modulation path synchronization system.
Figure 3B:
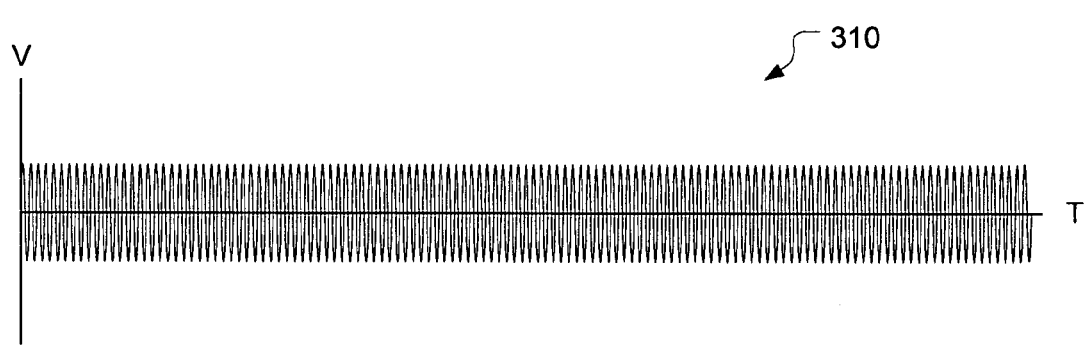
Figure 3C:
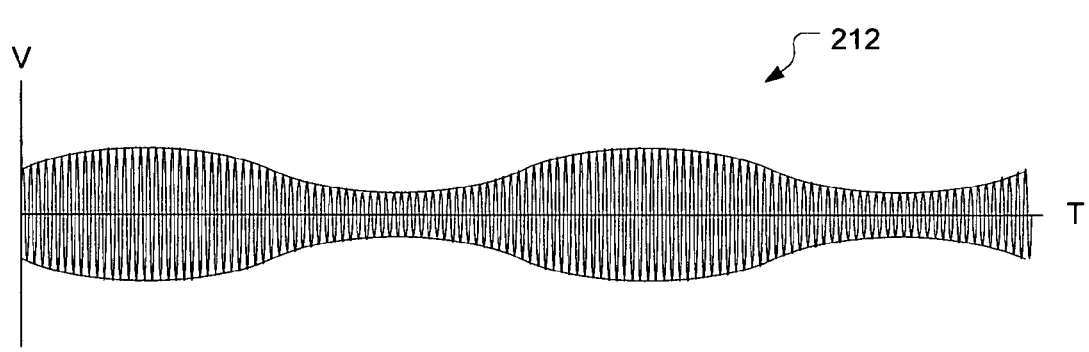
Figure 3D:
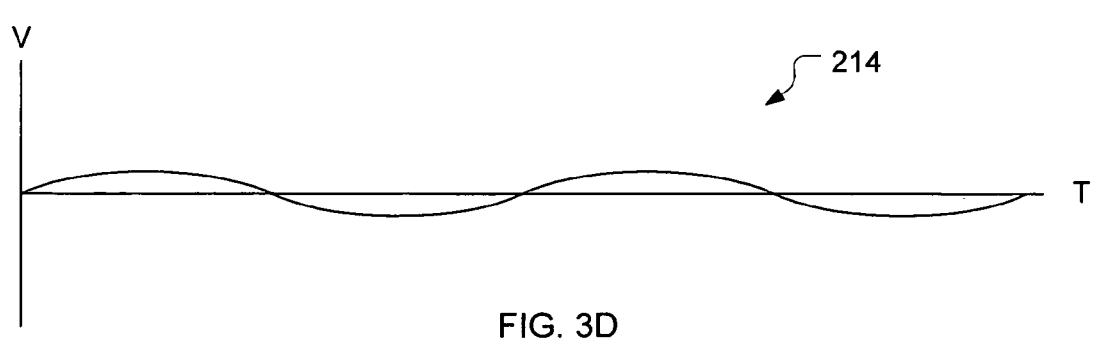

FIGS. 3A, B, C, D graphically illustrates various embodiments of waveforms in phase modulation path 126 synchronization system 200. Time (T) is displayed along the horizontal axis and voltage (V) or amplitude is displayed along the vertical axis. FIG. 3A graphically illustrates one embodiment of a baseband frequency training waveform 202. FIG. 3B graphically illustrates one embodiment of an RF carrier waveform 310 to modulate baseband frequency training waveform 202 at PA 124. FIG. 3C graphically illustrates one embodiment of AM training waveform 212 at the output of FM-to-AM converter 210. FIG. 3D illustrates one embodiment of detected waveform 214 at the output of envelope detection module 112.

This phase modulation path 126 delay measurement comprises a $3^{rd}$-order LPF with 450 MHz 3 dB band-width (BW) as the FM-to-AM converter 210. A $2^{nd}$-order filter with the same BW would result in substantially the same performance. Baseband frequency training waveform 202 and detected waveform 214 can be subjected to a slide-and-correlate operation to find the timing mis-alignment and, hence, to find delay $\tau_\phi$ of phase modulation path 126.

The amplitude-phase synchronization techniques described herein estimate a time delay mismatch between an input training waveform and a detected waveform after passing through respective amplitude and phase modulation paths of a polar transmitter. To synchronize the amplitude and phase modulation paths, the process further comprises correcting the time delay mismatch based on the estimated delay. Estimates of the time delay mismatch should be as accurate as possible to comply with limits mandated by any predetermined system specifications. For example, in WCDMA applications the time delay mismatch should be about τ±2 ns, for example. Correcting the time delay mismatch also should be done accurately (i.e., apply the estimated delay) within the limits mandated by system specifications.

Several techniques are described to synchronize the amplitude and phase modulation paths based on calculated estimates of time delay mismatch between the two paths. Several estimation techniques may be employed to detect the phase difference between training waveforms and output detected waveforms by correlating the detected waveforms 114, 214 with the respective input training waveforms 104, 202 during a synchronization training period. In various embodiments, training waveforms may be passed through each amplitude and phase modulation paths simultaneously during the synchronization training period. In this mode of operation, phase detection may be implemented with a detector comprising a series of downmixers to mix-down the modulated waveforms at the output of PA 124 with an un-modulated LO signal. In other embodiments, training waveforms may be passed through each amplitude and phase modulation paths individually, separately, or simultaneously during first and second synchronization training periods as described above with reference to FIGS. 1 and 2, for example.

As described with reference to FIG. 1, first, the envelope of AM training waveform 110 is detected and correlated with amplitude training waveform 104 to determine an estimated amplitude path delay $\tau_\alpha$. As described with reference to FIG. 2, second, FM training waveform 208 is converted to AM training waveform 212 and the envelope is detected and correlated with frequency training waveform 202 to determine an estimated phase path delay $\tau_\varphi$. Time delay mismatch between the amplitude and phase paths ($\tau_\alpha-\tau_\varphi$) can be determined by calculation. Alternatively, AM training waveform 110 can be correlated directly with FM training waveform 208 and time delay mismatch between the amplitude and phase paths ($\tau_\alpha-\tau_\varphi$) can be obtained directly.

In one embodiment, an ADC with a sufficient sampling rate may be coupled to the output node of envelope detection module 112. The ADC may be adapted to detect the envelope of AM training waveform 110, 112 in a single high resolution conversion to obtain a high resolution estimate of the time delay mismatch ($\tau_\alpha-\tau_\varphi$). Alternatively, a multi-stage signal processor may be employed to determine the time delay mismatch ($\tau_\alpha-\tau_\varphi$) between the amplitude and phase modulation paths. In one embodiment, an ADC with a moderate sampling rate may be coupled to the output node of envelope detection module 112. The ADC may be adapted to detect the envelope of AM training waveform 110, 112 in multiple conversions of varying resolutions. For example, the ADC may conduct a first "coarse" timing estimation computation followed by a second "fine" timing estimation computation. The second "fine" computation can be done via, for example, linear digital filter interpolation of the collected samples. These and various embodiments of other techniques are described more fully herein below.

Figure 4:
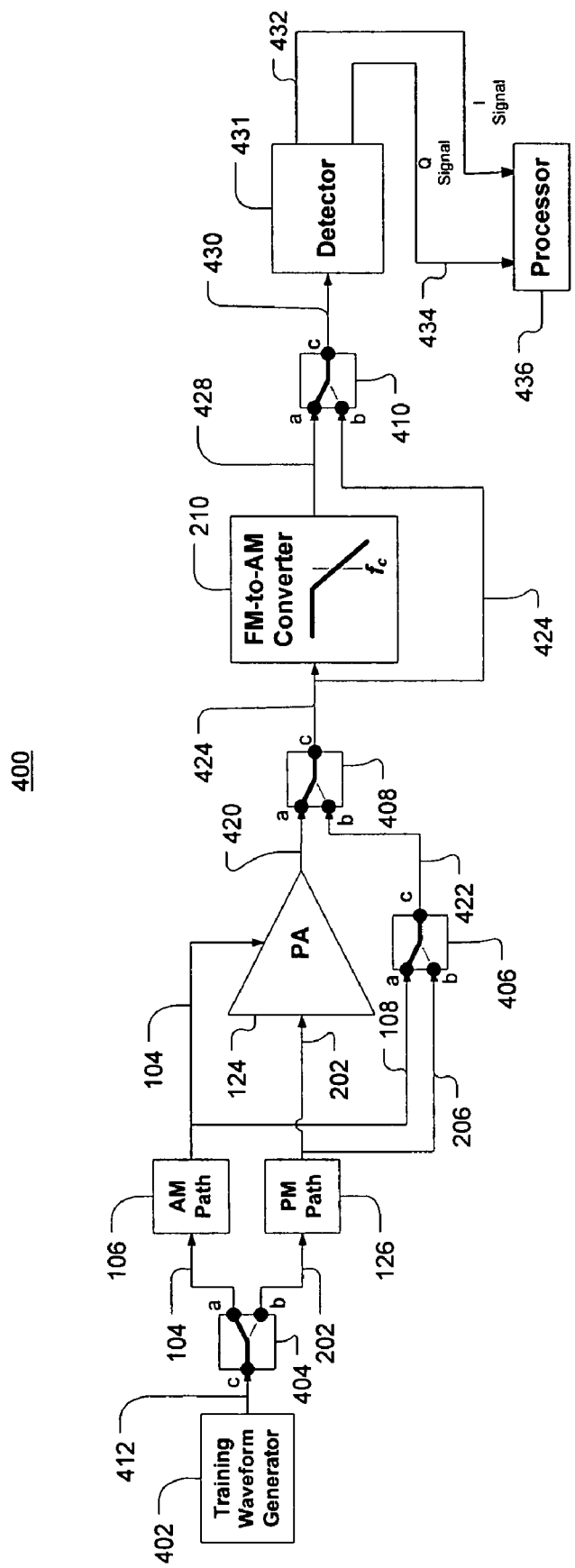
FIG. 4 illustrates one embodiment of a combined amplitude and phase modulation path synchronization system.

FIG. 4 illustrates one embodiment of a combined amplitude and phase modulation path synchronization system 400. In one embodiment, system 400 may be implemented in a RF polar modulation transmitter topology. System 400 may be configured to independently operate either in amplitude modulation path 106 training mode (determine amplitude path delay $\tau_\alpha$) or phase modulation path 126 training mode (determine phase path delay $\tau_\varphi$). The training mode of operation may be selected via the state of several switches 404, 406, 408. When the training mode is selected, the corresponding input training waveform 412 is generated. Accordingly, system 400 may be configured to switch between amplitude modulation path 106 training mode (e.g., system 100) or phase modulation path 126 training mode (e.g., system 200). Training waveform generator 402 generates the appropriate training waveform 412, e.g., amplitude training waveform 104 or frequency training waveform 202. In one embodiment, training waveform 412 may be a digital waveform, such as a digital sine wave waveform, for example. Switches 404, 406, 408, 410 comprise nodes "a" and "b" on one side and node c on the other side such that nodes a and c are coupled or node b and c are coupled based on the select state of the switch. Nodes a, b, and c may be employed as either input nodes or output nodes. Switches 404, 406, 408, and 410 adapt system 400 in amplitude modulation path 106 training mode or phase modulation path 126 training mode.

Training waveform 412 is coupled to input node c of switch 404. Training waveform 412 may be coupled to either amplitude modulation path 106 or phase modulation path 126 based on the training mode of system 400. If system 400 is in amplitude modulation path 106 training mode, training waveform 412 is amplitude training waveform 104 and is coupled to amplitude modulation path 106 via node a of switch 404. In one embodiment, training waveform 104 may be coupled to the amplitude modulation node of PA 124. Training waveform 104 is amplitude modulated with a carrier waveform at PA 124. AM training waveform 420 is produced at the output node of PA 124. In amplitude modulation path 106 training mode, AM training waveform 420 is equivalent to AM training waveform 110 previously described. AM training waveform 420 is coupled to node a of switch 408. In one embodiment, PA 124 may be bypassed by coupling amplitude training waveform 104 to node a of switch 406. Signal 422 at output node c of switch 406 is coupled to node b of switch 408. Either signal 422 (amplitude training waveform 104) or AM training waveform 420 (e.g., AM training waveform 110) may be coupled to node c of switch 408. Switch 408 may be employed to select whether AM training waveform 420 (AM training waveform 110) or signal 422 (amplitude training waveform 104) is passed through switch 408. In amplitude modulation path 106 training mode, AM training waveform 420 (e.g., signal 424) bypasses FM-to-AM converter 210 and is coupled to node c of switch 410. Signal 428 at the output node of FM-to-AM converter 210 (e.g., AM training waveform 212) is coupled to input node a of switch 410. In amplitude modulation path 106 training mode, switch 410 couples input signal 424 (e.g., AM training waveform 420) to detector 431. Accordingly, in amplitude modulation path 106 training mode, AM training waveform 424 bypasses FM-to-AM converter 210 and is coupled to input node b of switch 410. Switch 410 may couple either signal 428 (e.g., AM training waveform 212) or signal 424 (either amplitude signal 104 or AM training waveform 110) to detector 431. In one embodiment, detector 431 may be implemented as envelope detection module 112, for example. Detector 431 receives AM training waveform 430, detects the RF carrier envelope of AM training waveform 430, and extracts I component 432 and Q component 434 from the detected envelope. In one embodiment, detector 431 may be implemented as a synchronous detector. I component 432 and Q component 434 are provided to processor 436 to correlate and determine amplitude modulation and phase modulation path delays $\tau_\alpha$, $\tau_\varphi$, respectively. In one embodiment, processor 436 may be implemented as correlation and delay estimation module 116, for example.

If system 400 is in phase modulation path 126 training mode, training signal 412 is frequency training waveform 202 and is coupled to phase modulation path 126 via node b of switch 404. In one embodiment, frequency training waveform 202 may be coupled to the input node of PA 124 where it is frequency modulated with a RF carrier waveform to produce FM training waveform 420 at the output of PA 124. In one embodiment, PA 124 may be bypassed via switch 406. For example, frequency training waveform 202 may be coupled through switch 406 and through switch 408 directly to the input node of FM-to-AM converter 210. More specifically, in one embodiment, PA 124 may be bypassed by coupling signal 206 to node b of switch 406. Signal 422 at output node c of switch 406 is coupled to node b of switch 408. In other embodiments, either signal 422 (frequency training waveform 202) or FM training waveform 420 may be coupled to FM-to-AM converter 210 via node c of switch 408. In phase modulation path 126 training mode, however, switch 408 couples FM training waveform 420 to the input node of FM-to-AM converter 210. At the output node of FM-to-AM converter 210, AM training waveform 428 (converted AM training waveform 212) is coupled to input node a of switch 410. To bypass FM-to-AM converter 210, signal 424 is coupled from output node c of switch 408 to input node b of switch 410. Accordingly, switch 410 may be employed to couple either AM waveform 428 or signal 424 (either frequency training waveform 206 or FM training waveform 208) to detector 431. Detector 431 receives AM training waveform 430, detects the envelope, and extracts I component 432 and Q component 434. I component 432 and Q component 434 are coupled to processor 436 to correlate and determine amplitude modulation and phase modulation path delays $\tau_\alpha$, $\tau_\phi$, respectively. In one embodiment, processor 436 may be implemented as correlation and delay estimation module 218, for example.

Figure 5:
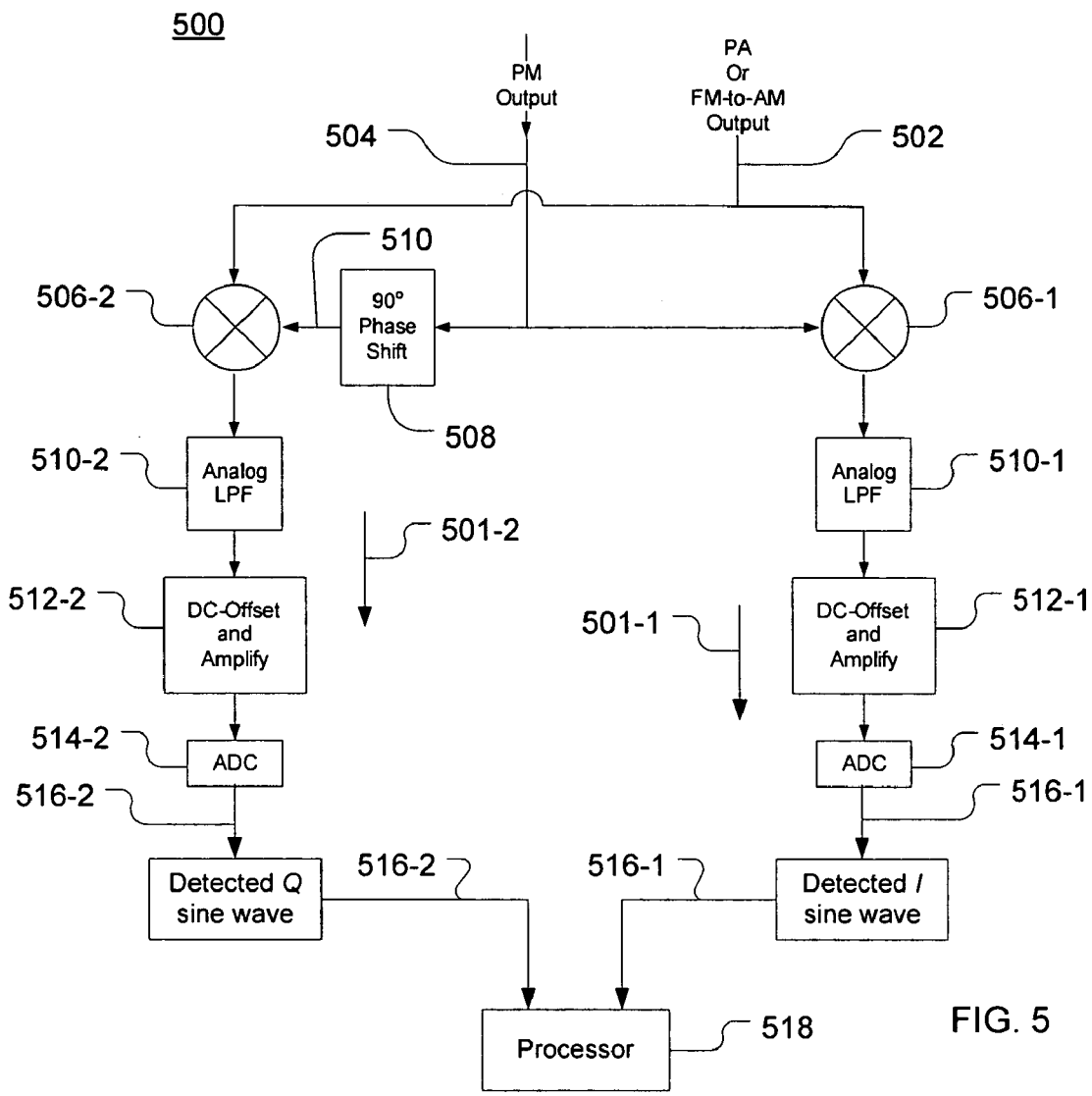
FIG. 5 illustrates one embodiment of a detector adapted for an amplitude and phase modulation path synchronization system.

FIG. 5 illustrates one embodiment of detector 500 (e.g., detector 431 as illustrated in FIG. 4) adapted for an amplitude and phase modulation path synchronization system. In one embodiment, detector 500 may be a synchronous detector. In one embodiment, envelope detection module 112, for example, may be implemented as detector 431. Detector 431 comprises a first I processing path 501-1 and a second Q processing path 501-2. First and second input signals 502, 504 are coupled to detector 431. In amplitude modulation path 106 training mode, first input signal 502 may be AM training waveform 110 from the output node of PA 124 or may be AM training waveform 212 from the output node of FM-to-AM converter 210. In phase modulation path 126 training mode, second input signal 504 is a phase modulator output from phase modulation path 126. Second input signal 504 is provided by the output of a phase modulator, a component which may be located in the phase path of a polar transmitter, for example. First input signal 502 is coupled to the signal input nodes of first and second mixers 506-1, 506-2. Second input signal 504 is coupled to the oscillator input node of first mixer 506-1 and is coupled to phase shifter 508. Phase shifter 508 produces third signal 510, which is 90° out-of-phase with second input signal 504. Third signal 510 is coupled to the oscillator input node of second mixer 506-2. First mixer 506-1 down-converts first input signal 502 with second input signal 504 to produce the in-phase time-varying I component of the baseband signal. First analog low pass filter 510-1 extracts the low frequency I component of the baseband signal from the down-converted signal. I component is amplified and any DC-offset is removed by first DC-offset and amplifier module 512-1. The output of first DC-offset and amplifier module 512-1 is converted to a digital version of time-varying I component 516-1 by first ADC 514-1 at a predetermined sampling rate. The output of first ADC 514-1 is a digital representation of the time varying I component of Cartesian I/Q baseband signals from which the polar form magnitude (R) and phase angle (θ) signals were derived. The digital I component 516-1 may be referred to as the detected I sine wave. Digital I component 516-1 is coupled to processor 518 to correlate, normalize, and/or slide-and-correlate the detected digital I component 516-1 in order to determine the amplitude-phase modulation path delays. Processor 518 may comprise various implementations of correlation delay and estimation modules 116, 218, and processor 436, for example.

As previously described, first input signal 502 is coupled to the signal input node of second mixer 506-2. Second signal 504 is phase shifted by 90° by phase shifter 508 to produce third signal 510, which is coupled to the oscillator input node of second mixer 506-2. Second mixer 506-1 down-converts input signal 502 with third signal 510 to produce the 90° out-of-phase quadrature time-varying Q component of the baseband signal. Second analog low pass filter 510-2 extracts the low frequency baseband Q component of the down-converted signal. The Q component is amplified and any DC-offset removed by second DC-offset and amplifier module 512-2. The output of second DC-offset and amplifier module 512-2 is converted to a digitized Q component 516-2 version of the time varying Q component by second ADC 514-2 at a predetermined sampling rate. Accordingly, the output of second ADC 514-2 is a digital representation of the time varying Q component of the Cartesian I/Q baseband signal from which the polar form magnitude (R) and phase angle (θ) signals were derived. The digital Q component 516-2 may be referred to as the detected Q sine wave. Digital Q component 516-2 is provided to processor 518 to correlate, normalize, and/or slide-and-correlate the detected digital Q component 516-2 in order to determine the amplitude-phase modulation path delays. Processor 518 may comprise various implementations of correlation and delay estimation modules 116, 218, and processor 436, for example.

The accuracy of the analog-to-digital conversion in detector 431 is related to the selected sampling rate for ADCs 512-1, 512-2 (ADC 512). The analog-to-digital conversion may be conducted in one-step or multiple-steps. Although ADC 512 is shown as a single module or block, ADC 512 may comprise a single ADC or multiple staged ADCs. In a one-step direct analog-to-digital conversion process, performance considerations may dictate a sufficiently high sampling rate, where a higher sampling rate yields better performance. ADC 512 may be adapted to operate at a sampling rate to achieve a predetermined level of performance. In a two-step analog-to-digital conversion process, a first conversion may be performed at a lower-sampling-rate and a second conversion may be performed at a higher-sampling rate. In one embodiment, in a first step, the method is to conduct the analog-to-digital conversion process at a moderate sampling rate. In a second step, the analog-to-digital conversion process is digitally up-sampled (e.g., the sampling rate of a signal is increased). Although, the two-step conversion process may not be as accurate as a high-sampling rate one-step direct sampling method, it may be better than the one-step direct conversion process at a lower sampling rate. The quantization limits of ADC 512 also should be considered for performance purposes. For example, the bit-width of the ADC 512 should be selected to satisfy a worst-case quantization error that does not result-in or correspond-to a timing error that is larger than the required accuracy of the specific implementation.

FM-to-AM converter 210 may have a non-linear response and may generate higher order frequency harmonics. Accordingly, performance of systems 200 and 400 depends in part on the non-linearity and the elimination of higher order harmonics generated by FM-to-AM converter 210. In one embodiment, FM-to-AM converter 210 may be implemented as a low-pass filter (LPF). The LPF may have a non-linear FM-to-AM response. For example, the AM response a(t) of FM-to-AM converter 210 to an FM modulated carrier signal (e.g., a sine wave tone sin($\omega_{tone}$t)) may be written as follows:

$$a(t) = c_0 + c_1(\Delta_{FM}\sin(\omega_{tone}t)) + c_2(\Delta_{FM}\sin(\omega_{tone}t))^2 + c_3(\Delta_{FM}\sin(\omega_{tone}t))^3 + \quad (1)$$

Where $F_{tone} = 2\pi\omega_{tone}$ is the FM modulated carrier signal frequency (e.g., sine wave frequency). Accordingly, the non-linearity will generate higher order harmonics (i.e., at $k*F_{tone}$; k=2,3, . . . ), which can be suppressed via digital filtering.

Quantization and circuit noise suppression in FM-to-AM converter 210 also should be considered. In detector 431, for, example, quantization noise as a function of frequency $N_Q(f)$ may be represented as:

$$N_Q(f) = \frac{(q^2/12)}{F_s}; -\frac{F_s}{2} \le f \le \frac{F_s}{2} \quad (2)$$

Where

-continued $$q = \text{Quantization Step} = \frac{V_{max}}{(2^{ADC\_BitWidth} - 1)} \quad (3)$$

and $F_s$ = Sampling Rate of $ADC$ 512

The circuit noise in detector 431 may be represented as:

$$N_C(f) = \frac{P_N}{F_s}; -\frac{F_s}{2} \le f \le \frac{F_s}{2} \quad (4)$$

Where $P_N$=Noise Power and $F_S$=Sampling Rate.

In one embodiment, filtering (e.g., LPF or band-pass-filtering (BPF) with corner/center at $F_{tone}$) may suppress most of the noise which is spread flat across the $F_2$ range to detect a single tone located at a FM modulated carrier frequency $F_{tone}$.

It is worthwhile noting that PA 124 bias may be such that the amplitude-modulation/phase-modulation (AM/PM) will rotate the I/Q components in a manner that makes the I or Q signal in one path stronger than the other. To balance out the I and Q components in I and Q paths 501-1, 501-2, the DC-offset and gain of the I and Q components may be independently adjusted by the first and second DC-offset and amplifier modules 512-1, 512-2. Once the DC-offset is removed and the gain is properly adjusted, the signals in both I and Q paths 501-1, 501-2 may cover the entire dynamic range of respective ADCs 514-1, 514-2. Otherwise, the weaker path signal may suffer excessive quantization if the weaker path signal is combined with the stronger path signal at processor 518 thus affecting the accuracy of the amplitude-phase time delay estimate.

Figure 6:
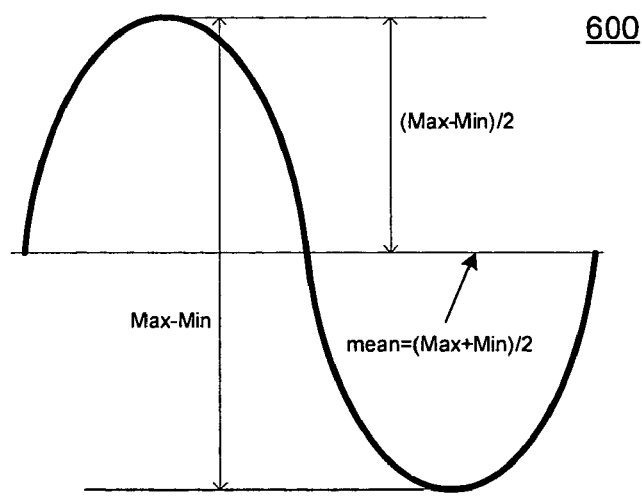
FIG. 6 graphically illustrates one embodiment of an AM waveform.

FIG. 6 graphically illustrates one embodiment of an AM waveform 600. The modulation frequency for AM waveform 600 is FM modulated carrier frequency $F_{tone}$. In one embodiment, AM waveform 600 is normalized and any DC-offset or bias removed by DC-Offset and amplifier modules 512-1, 512-2 in each I and Q component paths 501-1, 501-2, respectively, prior to analog-to-digital conversion. Multiple techniques may be used to normalize and remove the bias in AM waveform 600. In one embodiment, AM waveform 600 may be represented as a signal having a predetermined waveform shape and frequency. In the illustrative embodiments described below, AM waveform 600 may be defined as sine wave tone $\sin(\omega_{tone}t)$ at a frequency of $\omega_{tone}=2\pi F_{tone}$, for example. Normalization and bias removal techniques may comprise max-min, mean, and mean-square methods. In max-min method max is defined the positive peak and min is defined as the negative peak of AM waveform 600. In accordance with the max-min method, the mean and amplitude of AM waveform 600 may be calculated as:

$$\text{mean} = \frac{(\text{Max} + \text{Min})}{2} \quad (5)$$

and $$\text{amplitude} = \frac{(\text{Max} - \text{Min})}{2}. \quad (6)$$

In accordance with the mean and mean-square methods, if the sampling rate is an integer multiple of the sine wave frequency $\omega_{tone}=2\pi F_{tone}$, then the mean and amplitude of AM waveform 600 may be calculated as:

$$\text{mean} = \frac{1}{N}\sum_{n=0}^{N-1} s_n \quad (7)$$

and $$\text{amplitude} = \frac{1}{N}\sum_{n=0}^{N-1} s_n \quad (8)$$

Where $$N = \text{Number of samples per cycles} = \left\lfloor \frac{F_s}{F_{tone}} \right\rfloor = \frac{F_s}{F_{tone}} \text{ and} \quad (9)$$

$$s_n = \text{amplitude} \cdot (\sin(2\pi F_{tone} \cdot (n/F_s)) + \text{mean}) \quad (10)$$

If the sampling rate is not equal to an integer multiple of the AM waveform 600 carrier frequency $F_{tone}$, the summations above may not exactly equal to the mean and amplitude of the sine wave, and there may be a finite amount of bias error in the calculation.

Figure 7:
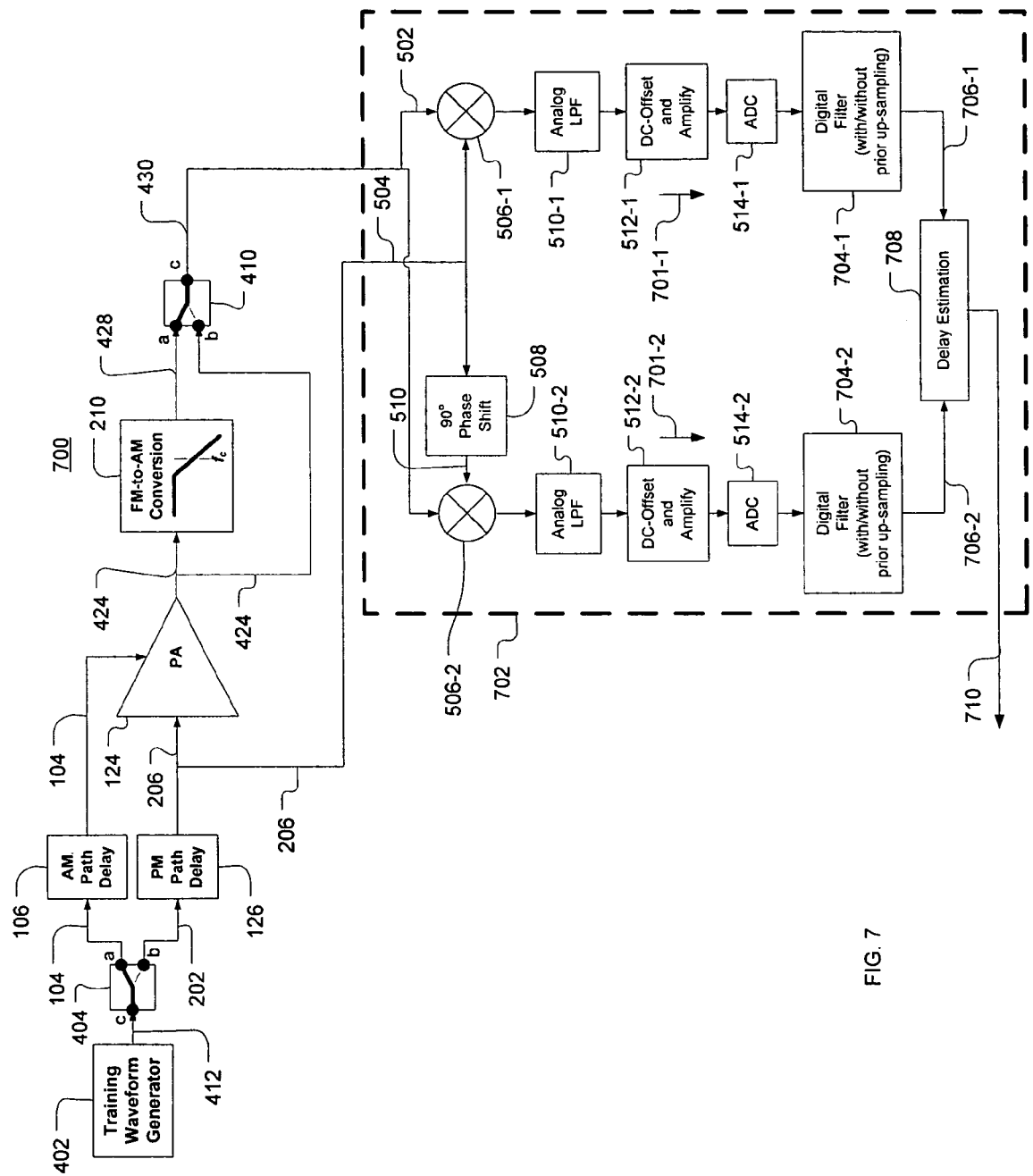
FIG. 7 illustrates one embodiment of a combination amplitude and phase modulation path synchronization system.

FIG. 7 illustrates one embodiment of a combination amplitude and phase modulation path synchronization system 700. In one embodiment, system 700 may be implemented in a RF polar modulation transmitter topology. In one embodiment, system 700 comprises similar components previously described with reference to FIGS. 1, 2, 4, and 5, the details of which will not be restated hereinbelow. Detector 702 is substantially similar to detector 431 previously discussed with reference to FIG. 5. Detector 702 includes I-path 701-1 and Q-path 701-2 comprising respective digital filters 704-1 and 704-2. Each digital filter 704-1, 704-2 may perform digital filtering processes with or without prior up-sampling. Output signals of digital filters 704-1, 704-2 comprise filtered digitized I and Q components 706-1 and 706-2, respectively. Digital I and Q components 706-1 and 706-2 are coupled to processor 708 for processing and determination of amplitude-phase modulation path delays. Processor 708 may comprise various embodiments of correlation delay and estimation modules 116, 218, and processor 436, 518, for example.

Although, the following functions are described as being performed by processor 708, these functions may be performed by any one of the previously discussed correlation delay and estimation modules 116, 218, and processors 436, 518 for example. Digital I and Q components 706-1, 706-2 may be combined and processed at the output of synchronous detector 702 by processor 708 to calculate amplitude-phase modulation path delays. Digital I and Q components 706-1, 706-2 may be represented as follows:

$$r(t) = I(t) + jQ(t) \quad (11)$$

$$I(t) = \underbrace{(\cos(\phi_{AM/PM}) \cdot \sin(\omega_{tone}(t-\tau)) + n_I(t))}_{I \text{ rail}} \quad (12)$$

$$Q(t) = \underbrace{(\sin(\phi_{AM/PM}) \cdot \sin(\omega_{tone}(t-\tau)) + n_Q(t))}_{Q \text{ rail}} \quad (13)$$

$$r(t) = \sin(\omega_{tone}(t-\tau)) \cdot [\cos(\phi_{AM/PM}) + j\sin(\phi_{AM/PM})] + [n_I(t) + jn_Q(t)] \quad (14)$$

$$\phi_{AM/PM} = \text{PA AM/PM rotation (distortion)} \quad (15)$$

$$n_I + jn_Q = (\text{Circuit} + \text{Quantization}) \text{ noise} \qquad (16)$$

$$\tau = \text{Amplitude}(\tau_\alpha) \text{ or Phase}(\tau_\phi)\text{Modulation Pathdelay to be estimated} \qquad (17)$$

Several techniques may be employed to combine and process digital I and Q components 706-1, 706-2, represented herein as sine waves for illustration purposes only, for example, to determine τ, the amplitude ($\tau_\alpha$) or phase ($\tau_\phi$) modulation path delay. The techniques may comprise, for example, selecting the I or Q path 701-1, 7012 based on signal strength, averaging the signal strengths in the I and Q paths 701-1, 7012, and determining the magnitude of the envelope of the signals in the I and Q paths 701-1, 701-2 as:

$$|R| = \sqrt{I^2 + Q^2} \qquad (18)$$

These methods are by no means exhaustive and other methods may be employed without departing from the scope.

Accordingly, in one embodiment, either I-path 701-1 or Q path 701-2 may be selected for processing based on which path has the stronger signal. This technique processes only the stronger of the two I or Q paths 701-1, 701-2. Differences in signal strengths may be attributed to bias imbalances in PA 124 due to AM/PM rotation of the IQ component in a way that makes one path (either I-path 701-1 or Q-path 701-2) substantially stronger than the other. Instead of balancing I-path 701-1 or Q-path 701-2 signals, in one embodiment, the path with stronger signal is selected for processing. This technique may be desirable if the DC-offset and gain stages in each I and Q paths 701-1, 701-2 cannot be independently adjusted to cover the full dynamic range of the ADCs 514-1, 514-2. Otherwise, if combined with the stronger path signal, the weaker path signal may be subject to excessive quantization error which may affect the accuracy of the amplitude-phase delay timing estimate (i.e., the weaker signal may act more like noise than useful information). Only one clean-up LPF and one normalization and bias-removal calculation is employed in I path 701-1 or Q path 701-1, whichever has the stronger signal.

If the signal power in I, Q paths 701-1, 701-2 cannot be independently adjusted for DC-offset and gain, the signal power in each I, Q path 701-1, 701-2 may be averaged. Also, if PA 124 bias is such that the AM/PM rotation will result in balanced I and Q components 706-1, 706-2 in respective I, Q paths 701-1, 701-2 having comparable strengths, then it may be possible to combine the I and Q components 706-1, 706-2 by calculating their average after normalization and bias-removal. This approach requires processing in both I and Q paths 701-1, 701-2. For example, two clean-up LPFs and two normalization and bias-removal calculations, and then the averaging operation in each I and Q path 701-1, 701-2.

In the envelope $\sqrt{I^2 + Q^2}$ determination method, the envelope of the digital I and Q components 706-1, 706-2 is determined, normalized, and the bias is removed. This method requires a CORDIC (or a square root function calculation), one clean-up LPF, and one normalization and bias-removal calculation.

Once digital I and Q components 706-1, 706-2 are combined, using any of the processes previously described, a maximum likelihood estimation technique is performed by processor 708. For maximum-likelihood estimation, digital I and Q components 706-1, 706-2 may be written as:

$$r(t) = I(t) + jQ(t) \qquad (11)$$

$$r(t) = (a+jb) \cdot \sin(\omega_{tone}(kT_s - \tau)) + n_{k,Circ} + n_{k,Quan} \qquad (19)$$

$$n_{k,Circ} = n_{k,Circ,I} + jn_{k,Circ,Q} = \text{Circuit noise (Additive Gaussian noise)} \qquad (20)$$

$$n_{k,uan} = n_{k,Quan,I} + jn_{k,Quan,Q} = \text{Quantization noise} \qquad (21)$$

If ADCs 514-1 and 514-2 have sufficient bit-widths (sufficient number of output bits) to resolve digital I and Q components 706-1, 706-2 the solution is one of detecting a tone in the presence of additive Gaussian noise (AGN), a process which may be computationally complex. However, in the present case, processor 708 is to determine an estimate of the phase (or timing) of the tone and not an estimate of the magnitude or frequency of the tone. Therefore, the solution may be more easily processed. For a discussion on techniques for coarse frequency acquisition through the discrete Fourier transform (DFT) computation for samples of a received waveform, reference is made to Walid K. M. Ahmed and P. J. McLane, "A Method for Coarse Frequency Acquisition for Nyquist Filtered MPSK", IEEE Transactions on Vehicular Technology, Nov. 1996, vol. 45, number 4, pp. 720-731, which is incorporated herein by reference in its entirety.

For an AGN channel, the maximum likelihood estimation technique attempts to find a time-delay that minimizes the log-likelihood metric (LLM) as follows:

$$L_{ML}(\tau) = (S_r - s_t(\tau)) \cdot C_{Noise}^{-1} \cdot (S_r - S_t(\tau))^T \qquad (22)$$

where $$C_{Noise}^{-1} = \text{Coveriance Matrix of the } AGN \qquad (23)$$

$$S_r = [s_{1,r}, s_{2,r} \ldots s_{M,r}]; s_{m,r} = c \cdot \sin(\omega_{tone}(mT_{s-\tau})) + n_m \qquad (24)$$

$$n_m = \text{Complex-valued Additive Gaussian Noise Random Variable} \qquad (25)$$

$$s_t = [s_{1,t}, s_{2,t} \ldots s_{M,t}]; s_{m,t} = \sin(\omega_{tone}(mT_s - \tau)) \qquad (26)$$

The timing estimate is the one that satisfies the condition:

$$\{\hat{\tau}: L_{ML}(\hat{\tau}) = \min_\tau [L_{ML}(\tau)]\} \qquad (27)$$

This operation may be conducted through an exhaustive search by scanning all possible delay values, which may be computationally complex. In the special case of additive white Gaussian noise (AWGN), the LLM is equivalent to the least-mean-square (LMS) method. The LMS method may be preferred over the LLM method because it is less computationally complex than the exhaustive search method. It can be shown that the maximum likelihood estimated frequency, amplitude, and delay time τ (i.e., tone phase) may be computed via the DFT of the received digital I and Q component 706-1, 706-2 samples. The maximum likelihood estimated frequency, amplitude, and delay time τ also may be computed using the fast Fourier transform (FFT) if M=2l, for example.

The calculation becomes simpler because the delay estimate τ or the tone phase (timing) is all that needs to be extracted by processor 708. Accordingly, it can be shown that the maximum likelihood estimated phase delay τ of the detected tone is:

$$\hat{\theta} = \frac{1}{2}[\text{Angle}(S_r(\omega)|_{\omega=\omega_{tone}}) + \text{Angle}(-j \cdot S_r(\omega)|_{\omega=\omega_{tone}})] \qquad (28)$$

-continued $$\hat{\tau} = \hat{\theta}/(\omega_{tone}) \quad (29)$$

Where $$S_r(\omega) = DFT(s_{m,r}) \quad (30)$$

$$S_r(\omega) = \frac{1}{M}\sum_{m=0}^{M-1} s_{m,r} e^{-jmT_s\omega} \quad (31)$$

Where $T_s$ is the sampling rate of ADCs 514-1, 514-2.

Therefore, the DFT (or the FFT) is not computed for the entire frequency range, but only at two points:

$$f = \pm f_{tone} \quad (32)$$

To implement these maximum likelihood estimation techniques, the operating point of the various components of system 700 may be selected according to the following criteria. For example, selecting the proper operating point of PA 124, converting a FM training waveform to an AM training waveform with FM-to-AM converter 210, and performing a synchronous detection of the AM training waveform with synchronous detector 702 such that the signal-to-noise ratio (SNR) at the inputs of ADCs 514-1, 514-2 is high enough for other techniques to be reliable and well performing. A sufficient dynamic range at the inputs of respective ADCs 514-1, 514-2 should be maintained to ensure sufficient bit-widths and minimum possible quantization noise in digital I and Q components 706-1, 706-2. After ADCs 514-1, 514-2 digital filters 704-1, 704-2 reduce the noise power and thus increase the SNR. If these maximum likelihood estimation techniques cannot be implemented, other techniques may be employed.

For example, if the aforementioned maximum likelihood estimation techniques are computationally complex with respect to given implementation limitations, other techniques may be employed to estimate the phase delay τ of the detected tone. For example, if the SNR in system 700 is relatively high, these other techniques may asymptotically approach the performance level of an optimal maximum likelihood estimation technique, provided they are not biased estimators. If the SNR in system 700 is relatively low, however, these other techniques may yield considerably inferior performance than the optimal maximum likelihood estimation technique. The following embodiments describe various techniques to determine amplitude-phase delay τ using a process other than the maximum likelihood estimation technique described above.

One amplitude and phase path delay τ estimation technique that may be employed is a one-step inverse-sine approach via look-up-table (LUT), for example. A delay estimate $\hat{\tau}_{InvSin}$ may be formed as follows:

$$\hat{\tau}_{InvSin} = \frac{1}{M}\sum_{m=0}^{M-1} [\sin^{-1}(s_{r,m}) - mT_s] \quad (33)$$

In equation (33), the phase wrapping and quadrant determination have been properly accounted for prior to its application.

One embodiment of an amplitude and phase path delay τ estimation technique is a one-step slide-and-correlate estimation technique that employs high-resolution sampling and high-resolution slide (HRS-HRS) techniques. A least-mean-square delay estimate $\hat{\tau}_{1Stp\text{-}C\&S}^{(LMS)}$ or a least-mean-absolute delay estimate $\hat{\tau}_{1Stp\text{-}C\&S}^{(LMA)}$ may be formed as follows:

Least-Mean-Square (LMS):

$$\hat{\tau}_{1Stp\text{-}C\&S}^{(LMS)} = \text{Arg}\left\{\max_{\substack{\tau=kT_{sample}\\k=-(M-1),\ldots,-1,0,1,\ldots,L(M-1)}}\left[\sum_m (s_{r,m} - s_{t,(m-k)})^2\right]\right\} \quad (34)$$

Or Least-Mean-Absolute (LMA):

$$\hat{\tau}_{1Stp\text{-}C\&S}^{(LMA)} = \text{Arg}\left\{\max_{\substack{\tau=kT_{sample}\\k=-(M-1),\ldots,-1,0,1,\ldots,L(M-1)}}\left[\sum_m |s_{r,m} - s_{t,(m-k)}|\right]\right\} \quad (35)$$

These techniques may employ high sampling-rate ADCs 514-1, 514-2 and multiple correlation computations. For a high-resolution estimate (e.g., 2 ns for WCDMA) $T_s$ should be as small as, or smaller than, the resolution required for the delay estimate τ.

One embodiment of an amplitude and phase path delay τ estimation technique is a one-step slide-and-correlate technique that employs low-resolution sampling and high-resolution slide (LRS-HRS). A least-mean-square delay estimate $\hat{\tau}_{1Stp\text{-}C\&S}^{(LMS)}$ or a least-mean-absolute delay estimate $\hat{\tau}_{1Stp\text{-}C\&S}^{(LMA)}$ may be formed as follows:

Least-Mean-Square (LMS):

$$\hat{\tau}_{1Stp\text{-}C\&S}^{(LMS)} = \text{Arg}\left\{\begin{array}{c}\max_{\tau=kT_{slide}}\\k=-(M-1),\ldots,-1,0,1,\ldots,L(M-1)\\\left[\sum_m (s_{r,m} - s_{t,(ml-k)})^2\right]\end{array}\right\} \quad (36)$$

Or Least-Mean-Absolute (LMA):

$$\hat{\tau}_{1Stp\text{-}C\&S}^{(LMA)} = \text{Arg}\left\{\begin{array}{c}\max_{\tau=kT_{slide}}\\k=-(M-1),\ldots,-1,0,1,\ldots,L(M-1)\\\left[\sum_m |s_{r,m} - s_{t,(lm-k)}|\right]\end{array}\right\} \quad (37)$$

$$l = T_{sample}/T_{slide} \quad (38)$$

This technique may not employ high sampling rate ADCs 514-1, 514-2. This technique may employ multiple correlation computations to scan all possible time delays at a high-resolution slide. Performance, however, may be expected to be somewhat inferior to that of the HRS-HRS method previously described.

Some techniques may require multiple steps. For example, an amplitude and phase path delay τ estimation technique is a two-step slide and correlate technique. During a first step, I and Q components 703-1, 703-2 at the respective inputs of ADCs 514-1, 514-2 are sampled at a low rate. A slide-and-correlate is conducted at the lower sampling rate using low-resolution-sampling and low-resolution slide (LRS-LRS). A first course timing estimate $\tau_{course}$ is determined. In a second step, I and Q components 703-1, 703-2 at the respective inputs of ADCs 514-1, 514-2 are digitally up-sampled at a higher sampling rate. A slide-and-correlate is conducted at the higher sampling rate using low-resolution-sampling and high-resolution slide (LRS-HRS) around the first course timing estimate $\tau_{course}$ and a second fine timing estimate $\tau_{fine}$ is determined.

A two-step inverse-sine slide and correlate approach also may be employed as an amplitude and phase path delay $\tau$ estimation technique. In a first step, I and Q components 703-1, 703-2 at the respective inputs of ADCs 514-1, 514-2 are sampled at a low rate, or may be sampled at a low rate and digitally up-sampled. A first coarse timing estimate $\tau_{course}$ may be calculated using the one-step inverse sine computation previously described with reference to equation (33) to solve for $\hat{\tau}_{InvSin}$. In a second step, I and Q components 703-1, 703-2 at the inputs of respective ADCs 514-1, 514-2 are sampled at the same low rate, or may be further digitally up-sampled. A slide and correlate is conducted using LRS-HRS around the course timing estimate $\tau_{course}$ and a second fine timing estimate $\tau_{fine}$ is then determined.

Figure 8:
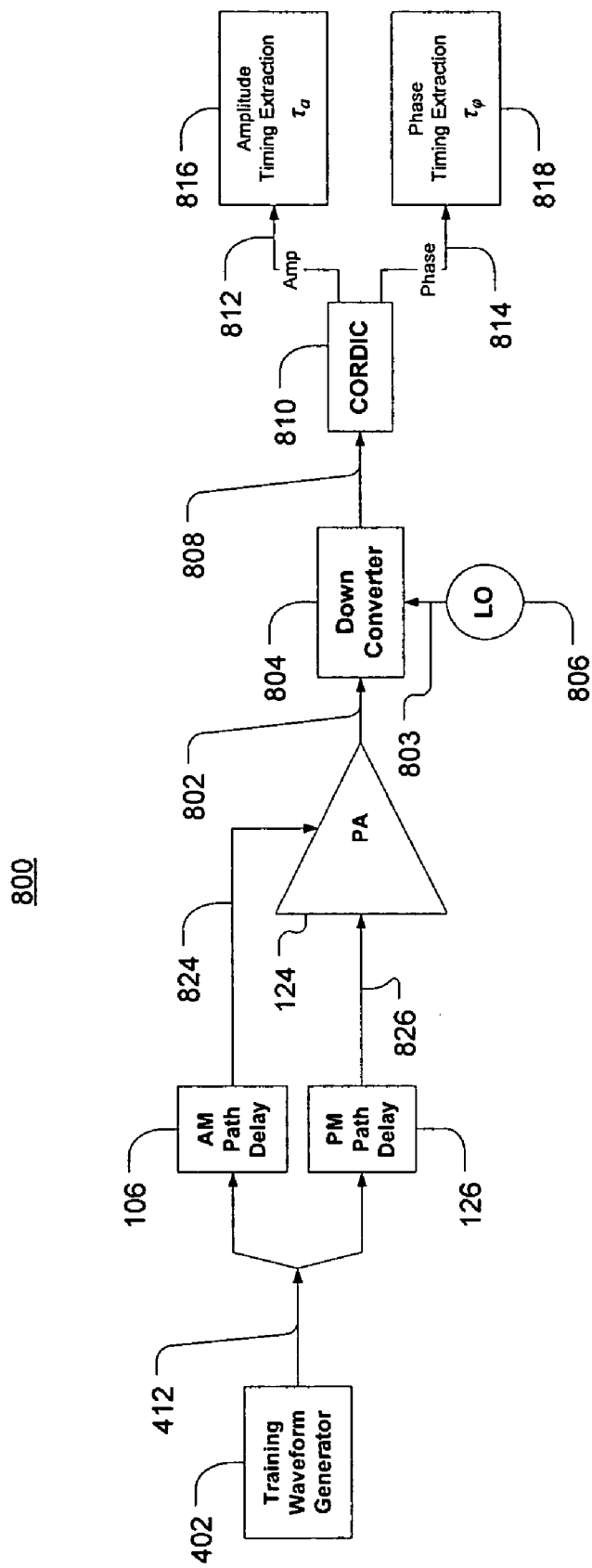
FIG. 8 illustrates one embodiment of a combination amplitude and phase modulation path synchronization system.

FIG. 8 illustrates one embodiment of a combination amplitude and phase modulation path synchronization system 800. In one embodiment, system 800 may be implemented in a RF polar modulation transmitter topology. System 800 comprises down converter 804 to mix-down output signal 802 with an un-modulated oscillator signal 803 from LO 806. Training waveform generator 402 generates training waveform 412. Training waveform 412 is passed to both amplitude modulation path 106 and phase modulation path 126 simultaneously. Amplitude training waveform 824 is coupled to the amplitude modulation node of PA 124 and is amplitude modulated with a carrier waveform. Frequency training waveform 826 is coupled to the input node of PA 124 and is frequency modulated with the carrier waveform. Output signal 802 of PA 124 is coupled to down converter 804. LO 806 is coupled to the oscillator node of down converter 804. LO 806 generates oscillator signal 803 to mix with output signal 802. In one embodiment, down converter 804 may be implemented as one embodiment of detectors 431, 702 (e.g., a synchronous detector and the like) with the oscillator node coupled to LO 806. Down converted output signal 808 is coupled to a CORDIC module 810 to extract amplitude signal 812 and phase signal 814. Amplitude signal 812 is coupled to amplitude timing extraction module 816 to determine the amplitude delay $\tau_\alpha$ and phase signal 814 is coupled to phase timing extraction module 818 to determine the phase delay $\tau_\phi$.

If training signal 412 is a sine wave, the analysis discussed with respect to FIG. 7 may be applied to system 800 to determine the amplitude delay $\tau_\alpha$ and the phase delay $\tau_\phi$. Down-converted signal 808 is coupled to a CORDIC module 810 to extract amplitude and phase signals 812, 814. Relative to systems 100, 200, 400, 600, and 700, however, system 800 may provide a much larger dynamic range of the extracted amplitude and phase signals 812, 814 relative to any associated DC offsets. This may relax the circuit noise tolerance of the feedback path RF components, for example. System 800 saves acquisition time by sending both the amplitude and phase training waveform 412 patterns simultaneously to both amplitude and phase modulation paths 106, 126 and then uses CORDIC module 810 to separate amplitude and phase signals 812, 814. Once the amplitude and phase signals 812, 814 are separated, the amplitude delay $\tau_\alpha$ and the phase delay $\tau_\phi$ are determined by the respective amplitude timing extraction module 816 and phase timing extraction module 818. In this embodiment it is assumed that PA 124 can be biased at a point where the AM/PM error is small such that no distortion, manifested as an additive noise quantity, takes place relative to phase signal 814. Otherwise, training sessions for amplitude modulation path 106 and phase modulation path 126 should be conducted separately as in the FM-to-AM approaches discussed with reference to FIGS. 1-7 above.

Figure 9:
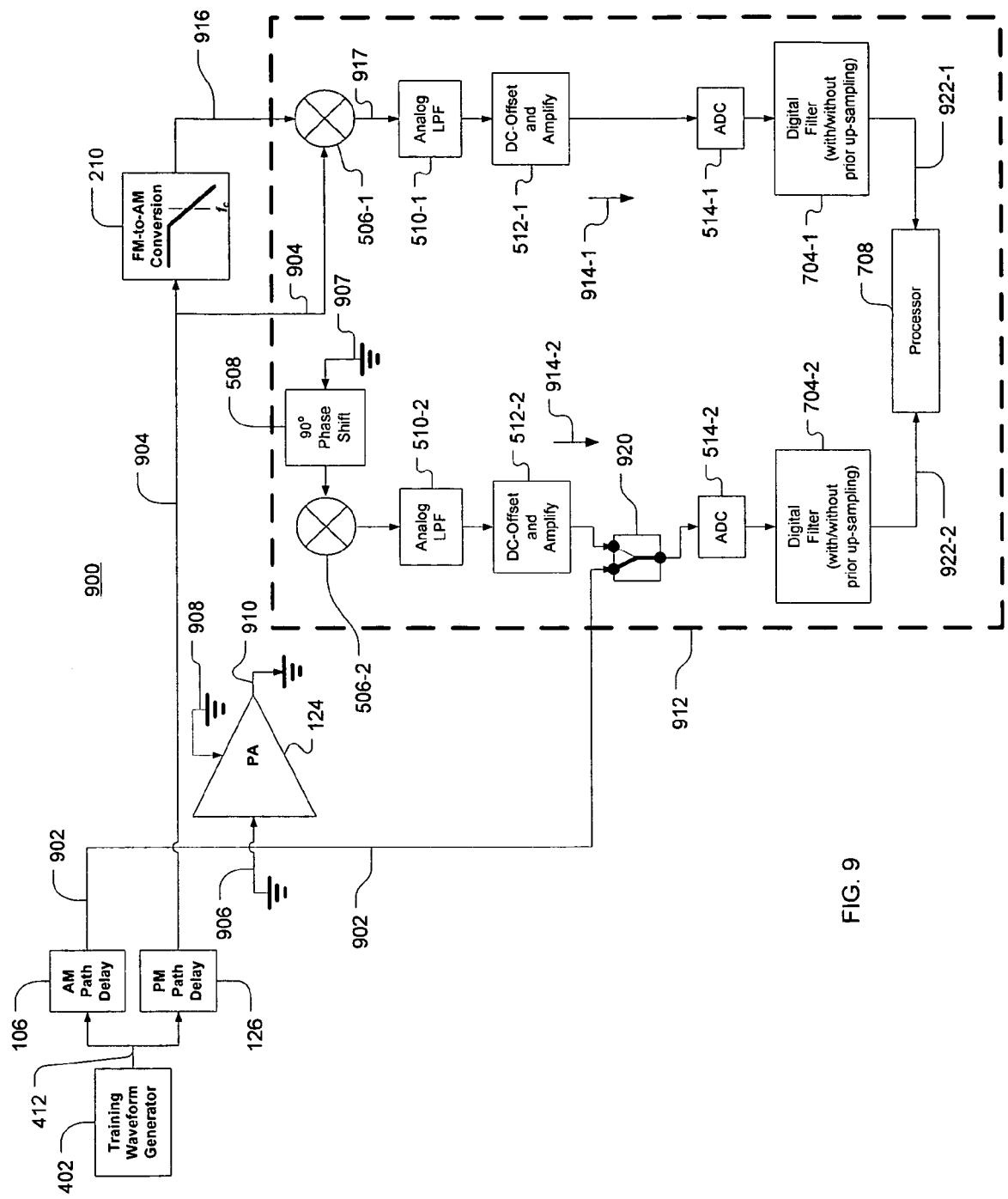
FIG. 9 illustrates one embodiment of an amplitude and phase modulation path synchronization system.

FIG. 9 illustrates one embodiment of an amplitude and phase modulation path synchronization system 900. In one embodiment, system 900 may be implemented in a RF polar modulation transmitter topology. System 900 is a conceptual level functional illustration of synchronization system 900 and is not an illustration of actual circuit connections. Training waveform generator 402 generates training waveform 412, which is passed to both amplitude modulation path 106 and phase modulation path 126 simultaneously. Amplitude path training waveform 902 is passed directly to detector 912. Phase path training waveform 904 is coupled to cascaded FM-to-AM converter 210 and to detector 912. In one embodiment, phase modulation path 126 may comprise a voltage controlled oscillator (VCO) coupled to FM-to-AM converter 210. In one embodiment, FM-to-AM converter 210 may be implemented as a 450 MHz LPF (for a 900 MHz and 1800 MHz carrier frequency, for example), for example. During a synchronization training period, either PA 124 or the antenna is switched-off (or both) to effectively bypass PA 124 and to essentially disable input node 906, amplitude modulation node 908, and output node 910. This is conceptually illustrated by the ground symbols at the input node 906, amplitude modulation node 908, and output node 910. Amplitude modulation path 106 may comprise an anti-alias filter (AAF) coupled to the amplitude modulation node 908 of PA 124.

Detector 912 comprises first and second paths 914-1, 914-2. Either path 914-1 or path 914-2 may be employed to process amplitude training waveform 902 or phase training waveform 904. In the illustrated embodiment, the input node 907 of phase shifter 508 is disabled and mixer 506-2, analog LPF 510-2 and DC-offset and amplifier 512-2 are bypassed. In one embodiment, amplitude path training waveform 902 may be tapped at amplitude modulation node 908 of PA 124, i.e., at the AAF output, and it is routed "directly" to ADC 514-2 in second path 914-2 of detector 912 via switch 920. Phase training waveform 904 is coupled to the oscillator input node of mixer 506-1. AM training waveform 916 at the output node of FM-to-AM converter 210 is coupled to the input node of mixer 506-1. Accordingly, phase training waveform 904 and AM training waveform 916 are mixed at mixer 516-1. Mixer 506-1 produces signal 917, which is processed along path 914-1.

Amplitude training waveform 902 and phase training waveform 904 are processed by detector 912. Detected signals 922-1 and 922-2 at the output node of each ADC 514-1, 514-2 are processed independently by respective digital filters 704-1, 704-2. Accordingly, detected signals 924-1, 924-2 may be processed independently by processor 708 to extract the timing information associated with each signal, e.g., amplitude training waveform 902 and phase training waveform 904. Accordingly, amplitude modulation path delay $\tau_\alpha$ and phase modulation path delay $\tau_\phi$ may be obtained simultaneously.

Figure 10:
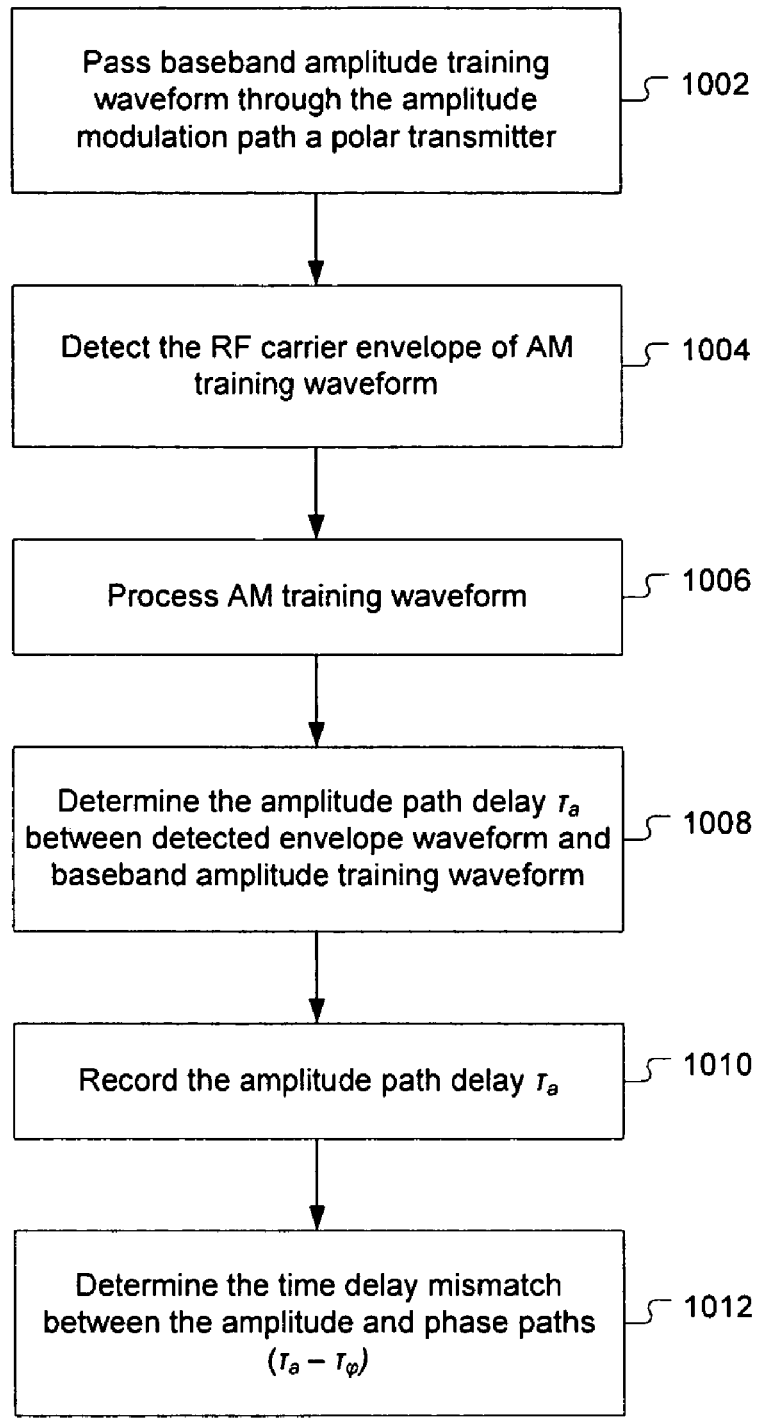
FIG. 10 is a flow diagram of one embodiment of a synchronization process to determine a delay in an amplitude modulation path of an RF transmitter in a polar modulation topology.

FIG. 10 is a flow diagram 1000 of one embodiment of a synchronization process to determine a delay in an amplitude modulation path of an RF transmitter in a polar modulation topology. As previously discussed, the synchronization process may be conducted by estimating the amplitude modulation path delay and the phase modulation path delay either individually as shown with reference to systems 100, 400, 700 shown in respective FIGS. 1, 4, and 7, for example, or simultaneously as shown with reference to systems 800, 900 shown in FIGS. 8 and 9, for example. In this embodiment, the synchronization process is described with reference to system 100 shown in FIG. 1, although a similar synchronization process may be applied to systems 400 and 700 in FIGS. 4 and 7. Synchronization is conducted by determining the amplitude modulation path 106 delay $\tau_\alpha$ separately from the phase modulation path 126 delay $\tau_\phi$. Baseband amplitude waveform generator 102 generates baseband amplitude training waveform 104 and provides amplitude training waveform 104 in the amplitude modulation path 106. Baseband amplitude waveform generator 102 passes (1002) baseband amplitude training waveform 104 through the amplitude modulation path 106 of a polar transmitter. At PA 124 amplitude modulation node, baseband amplitude training waveform 104 is amplitude modulated with an RF carrier waveform to produce AM training waveform 110. Envelope detection module 112 detects (1004) the RF carrier envelope of AM training waveform 110 at an output node of PA 124. Envelope detection module 112 and/or processor 116 processes (1006), e.g., normalize and slide-and-correlate AM training waveform 110. Processor 116 determines (1008) the amplitude path delay $\tau_\alpha$ between detected envelope waveform 114 and baseband amplitude training waveform 104. The best-estimate time delay is the one that corresponds to the best correlation factor between detected envelope waveform 114 and baseband amplitude training waveform 104. Processor 116 records (1010) the amplitude path delay $\tau_\alpha$ and determines (1012) the time delay mismatch between the amplitude and phase paths $\tau_\alpha-\tau_\phi$, where $\tau_\phi$ is the phase path time delay.

Figure 11:
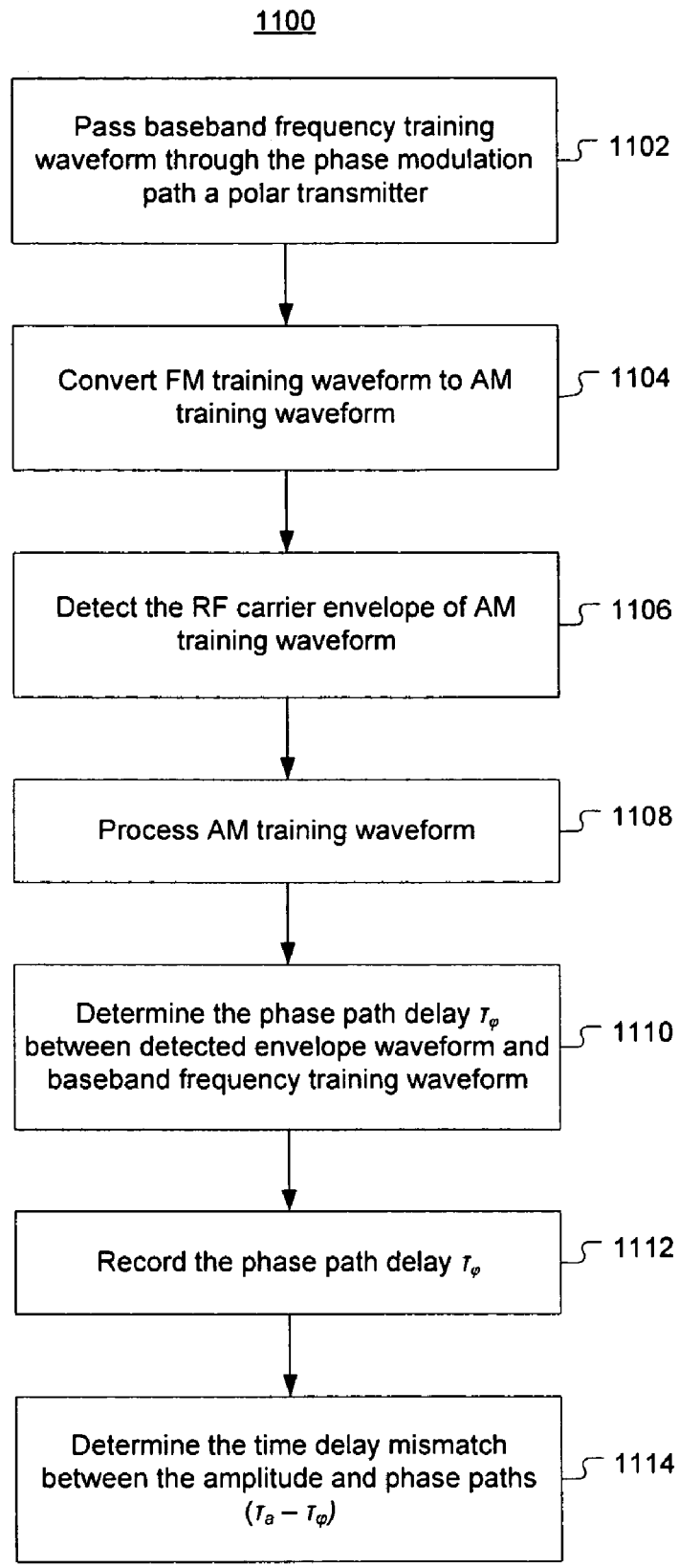
FIG. 11 is a flow diagram of one embodiment of a synchronization process to determine a delay in a phase modulation path of an RF transmitter in a polar modulation topology.

FIG. 11 is a flow diagram 1100 of one embodiment of a synchronization process to determine a delay in a phase modulation path of an RF transmitter in a polar modulation topology. As previously discussed, the synchronization process may be conducted by estimating the amplitude modulation path delay and the phase modulation path delay either individually as shown with reference to systems 100, 400, 700 shown in respective FIGS. 1, 4, and 7, for example, or simultaneously as shown with reference to systems 800, 900 shown in FIGS. 8 and 9, for example. In this embodiment, the synchronization process is described with reference to system 200 shown in FIG. 2, although a similar synchronization process may be applied to systems 400 and 700 in FIGS. 4 and 7. Synchronization is conducted by determining the phase modulation path 126 delay $\tau_\phi$ separately from the amplitude modulation path 106 delay $\tau_\alpha$. Baseband frequency waveform generator 218 generates baseband frequency training waveform 202 and provides frequency training waveform 202 in the phase modulation path 126. Baseband frequency training waveform 202 may be integrated by integrator 204. Integrated baseband frequency training waveform 206 is passed (1102) through the phase modulation 126 path of the polar transmitter. At the input node of PA 124, integrated baseband frequency waveform 206 is frequency modulated with the carrier waveform to produce FM training waveform 208. FM-to-AM converter 210 converts (1104) FM training waveform 208 to AM training waveform 212. As previously discussed, in one embodiment, FM-to-AM converter 210 may be a LPF, a tuning circuit, or the like. Envelope detection module detects (1106) the envelope waveform of the RF carrier of AM training waveform 212. Envelope detection module 112 or processor 218 processes (1108), e.g., normalize and slide-and-correlate AM training waveform 212. Processor 218 determines (1110) the phase path delay $\tau_\phi$ between detected envelope training waveform 214 and baseband frequency training waveform 202. The best-estimate time delay is the one that corresponds to the best correlation factor between detected envelope waveform 214 and baseband frequency training waveform 202. Processor 218 records (1112) the amplitude path delay $\tau_\phi$. Processor 218 determines (1114) the time delay mismatch between the amplitude and phase paths $\tau_\alpha-\tau_{100}$, where $\tau_\alpha$ is the amplitude path time delay.

Figure 12:
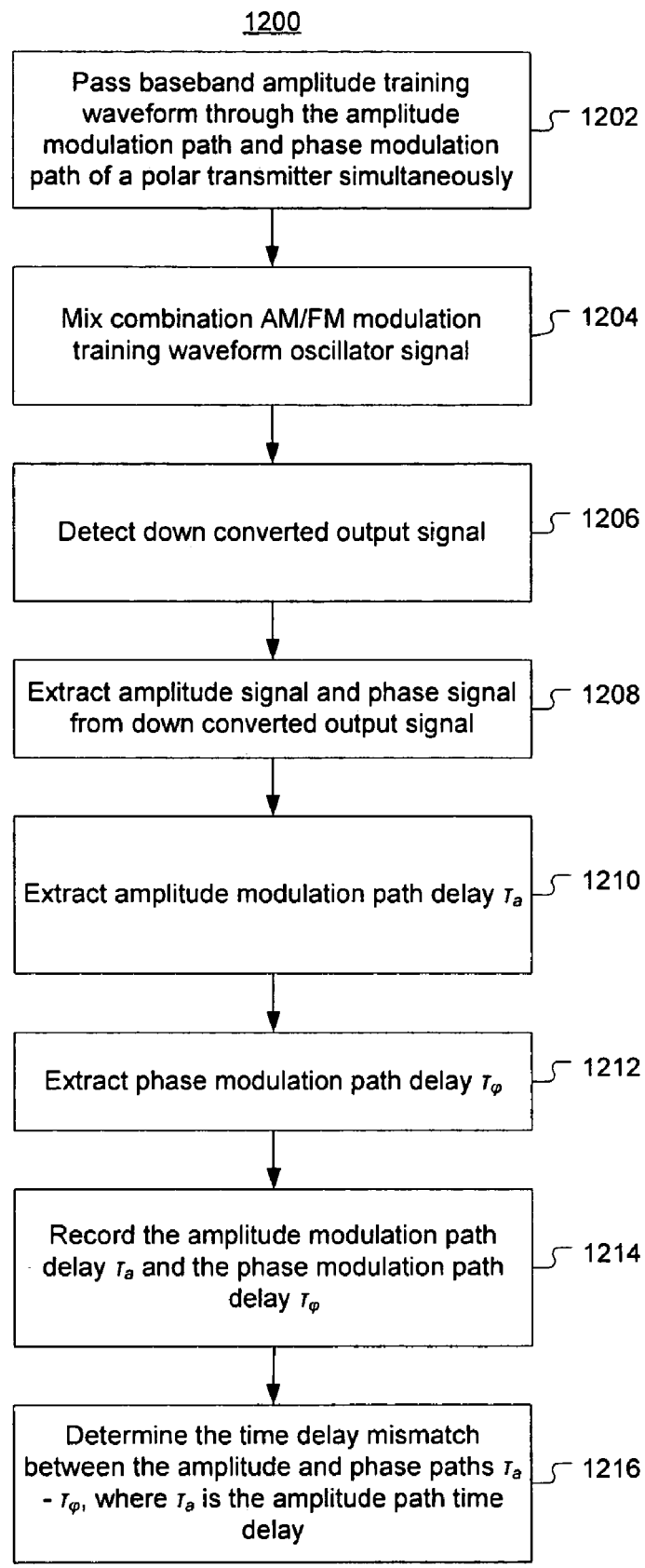
FIG. 12 is a flow diagram of one embodiment of a process to estimate delay in an amplitude path and a phase path simultaneously.

FIG. 12 is a flow diagram 1200 of one embodiment of a process to estimate delay in an amplitude path and a phase path simultaneously. The amplitude modulation path delay $\tau_\alpha$ and the phase modulation path delay $\tau_\phi$ may be calculated simultaneously. Reference is made to synchronization system 800 illustrated in FIG. 8, for example. Training waveform generator 402 generates baseband amplitude and phase training waveform 412 and passes (1202) baseband amplitude training waveform 412 through the amplitude modulation path 106 and phase modulation path 126 of a polar transmitter simultaneously. At an amplitude modulation input node of PA 124, baseband amplitude modulation training waveform 824 is amplitude modulated with a carrier waveform. At an input node of PA 124, baseband frequency waveform 826 is frequency modulated with the carrier waveform. Combination AM/FM modulation training waveform 802 is produced at an output node of PA 124. Down converter 804 mixes (1204) combination AM/FM modulation training waveform 802 oscillator signal 803. Down converted output signal 808 is detected (1206) by CORDIC module 810. CORDIC module 810 extracts (1208) amplitude signal 812 and phase signal from down converted output signal 808. Amplitude timing extraction module 816 extracts (1210) amplitude modulation path 106 delay $\tau_\alpha$. Phase timing extraction module 818 extracts (1212) phase modulation path 126 delay $\tau_\phi$. Once the amplitude modulation path 106 delay $\tau_{60}$ and the phase modulation path 126 delay $\tau_\phi$ are extracted a processor may be employed to record (1214) the amplitude modulation path 106 delay $\tau_\alpha$ and the phase modulation path 126 delay $\tau_\phi$ and determine (1216) the time delay mismatch between the amplitude and phase paths $\tau_\alpha-\tau_\phi$, where $\tau_\alpha$ is the amplitude path time delay.

Figure 13:
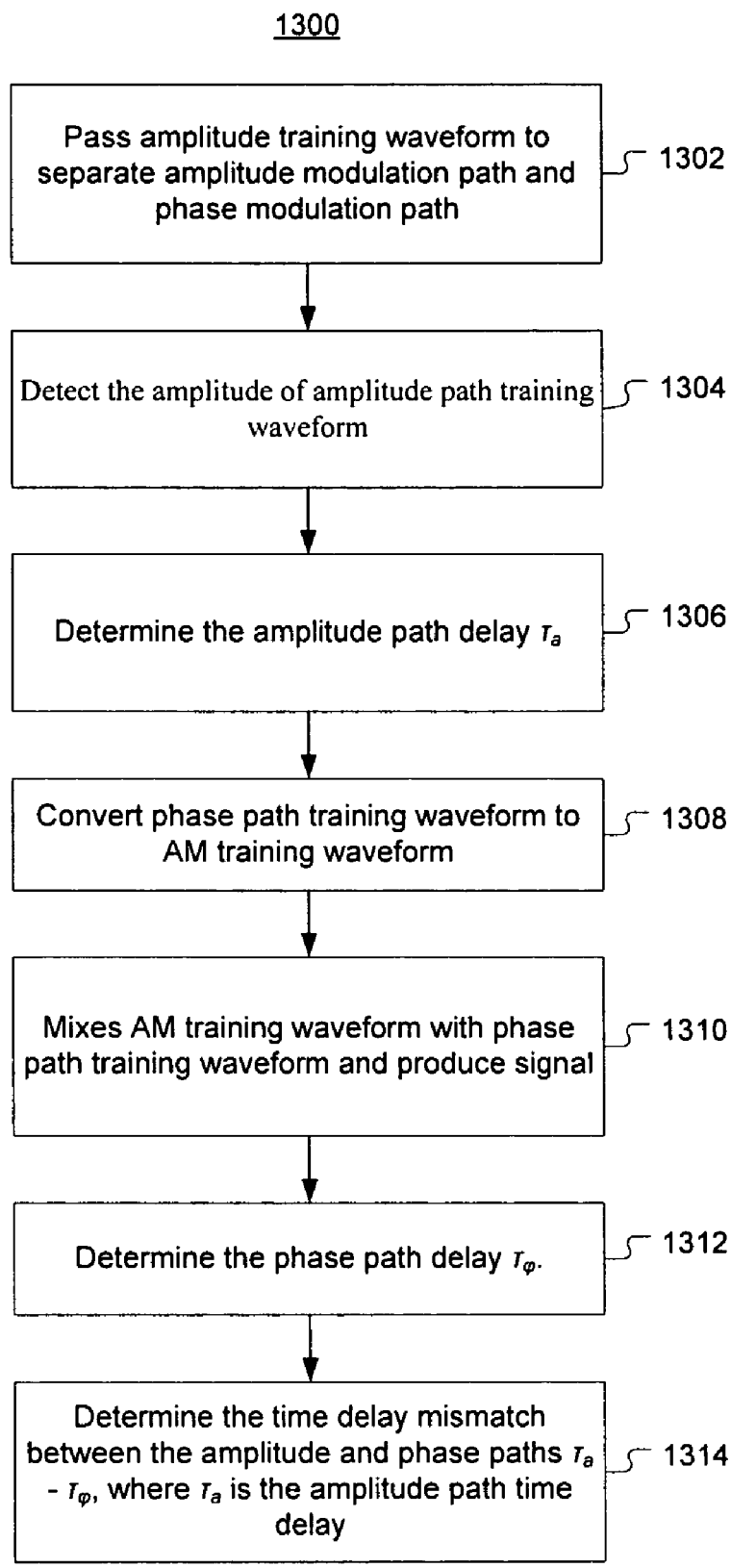
FIG. 13 is a flow diagram of one embodiment of a process to estimate delay in an amplitude path and a phase path simultaneously.

FIG. 13 is a flow diagram 1300 of one embodiment of a process to estimate delay in an amplitude path and a phase path simultaneously. The amplitude modulation path delay $\tau_\alpha$ and the phase modulation path delay $\tau_{100}$ may be calculated simultaneously. Reference is made to synchronization system 900 illustrated in FIG. 9, for example. Training waveform generator 402 generates baseband amplitude and phase training waveform 412 and passes (1302) amplitude training waveform 412 to separate amplitude modulation path 106 and phase modulation path 126. Amplitude path training waveform 902 is passed (1304) directly to detector 912. Detector 912 detects (1306) the amplitude of amplitude path training waveform 902. Processor 708 determines (1306) the amplitude path delay $\tau_\alpha$. Phase path training waveform 904 is coupled to cascaded FM-to-AM converter 210 and to detector 912. FM-to-AM converter 210 converts (1308) phase path training waveform 904 to AM training waveform 916. Mixer 506-1 mixes (1310) AM training waveform 916 with phase path training waveform 904 and produces signal 917. Signal 917 is processed in path 914-1. Detector 912 detects (1316) the phase of phase path training waveform 904. Processor 708 determines (1312) the phase path delay $\tau_\phi$. Once the amplitude modulation path 106 delay $\tau_\alpha$ and the phase modulation path 126 delay $\tau_\phi$ are extracted, processor 708 determines (1314) the time delay mismatch between the amplitude and phase paths $\tau_\alpha-\tau_\phi$, where $\tau_\alpha$ is the amplitude path time delay.

Once the time delay mismatch is determined, then the timing mismatch between phase and amplitude paths can be corrected in polar transmitter in accordance with conventional techniques. Accordingly, the time delay mismatch may be used to synchronize the phase and amplitude paths. For example, the time delay mismatch may be applied to correct the timing misalignment between the phase and amplitude path signals because the timing misalignment may be detrimental to the reconstructed I/Q components, for example. Accordingly, polar transmitters amplitude R and phase θ signals may be synchronized employing the time delay mismatch to correct for the timing misalignments due to different delays encountered by these signals in the separate amplitude R and phase θ processing paths.

In various embodiments, the systems described herein may be illustrated and described as comprising several separate functional elements, such as modules and/or blocks. Although certain modules and/or blocks may be described by way of example, it can be appreciated that additional or fewer modules and/or blocks may be used and still fall within the scope of the embodiments. Further, although various embodiments may be described in terms of modules and/or blocks to facilitate description, such modules and/or blocks may be implemented by one or more hardware components (e.g., processors, DSPs, PLDs, ASICs, circuits, registers), software components (e.g., programs, subroutines, logic) and/or combination thereof.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some embodiments may be implemented using an architecture that may vary in accordance with any number of factors, such as desired speed, power levels, heat tolerances, semiconductor manufacturing processing, input rates, output rates, memory resources, and other performance constraints.

Some embodiments may be described using the expression "coupled" along with their derivatives. It should be understood that the term "coupled" may be used to indicate that two or more elements are in direct physical or electrical contact. The term "coupled," however, also may mean that two or more elements are not in direct contact with each other, but yet still co-operate or interact with each other. The embodiments are not limited in this context.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. A modulation path synchronization apparatus in a polar transmitter, comprising:
   an amplitude modulation path to receive an amplitude training waveform and a phase modulation path to receive a frequency training waveform;
   a detector coupled to said modulation paths, said detector to detect modulated training waveforms; and
   a processor coupled to said detector, said processor to determine a delay between said training waveforms and said modulated training waveforms;
   wherein said detector is to detect a first modulated training waveform associated with said amplitude training waveform and to generate a first envelope waveform and said detector to detect a second modulated waveform associated with said frequency training waveform and generate a second envelope waveform; and
   wherein said processor is to correlate said first envelope waveform with said first amplitude training waveform to determine an amplitude modulation path delay; and said processor is to correlate said second envelope waveform with said frequency training waveform to determine a phase modulation path delay.

2. The apparatus of claim 1, comprising:
   a modulation converter coupled to said modulation path to convert a modulated waveform to said modulated training waveform.

3. The apparatus of claim 1, wherein said detector comprises a synchronous detector.

4. The apparatus of claim 1, wherein said detector comprises a down converter coupled to a coordinate rotation digital computer (CORDIC) module to extract an amplitude component and a phase component from said modulated training waveform.

5. A method to synchronize modulation paths in a polar transmitter, the method comprising:
   passing a baseband amplitude training waveform in an amplitude modulation path;
   passing a baseband frequency training waveform in a phase modulation path;
   detecting a carrier envelope of a first amplitude modulated training waveform associated with said amplitude training waveform;
   converting a frequency modulated training waveform associated with said frequency training waveform to a second amplitude modulated training waveform associated with said frequency training waveform; and
   determining an amplitude modulation path delay.

6. The method of claim 5, comprising detecting a carrier envelope of said second modulated training waveform.

7. The method of claim 6, comprising determining a phase modulation path delay.

8. The method of claim 7, comprising correlating said detected carrier envelope of said second modulated training waveform with said baseband frequency training waveform.

9. The method of claim 5, comprising processing said detected carrier envelope.

10. The method of claim 9, comprising:
    normalizing said detected carrier envelope; and
    removing a bias in said detected carrier envelope.

11. The method of claim 5, comprising:
    estimating said modulation path delay using a maximum-likelihood estimation calculation.

12. The method of claim 5 comprising:
    estimating said modulation path delay using a one-step inverse sine calculation.

13. The method of claim 5, comprising:
    estimating said modulation path delay using a one-step slide and correlate calculation.

14. The method of claim 5, comprising:
    estimating said modulation path delay using a two-step slide and correlate calculation.

15. The method of claim 5, comprising:
    estimating said modulation path delay using a two-step inverse sine slide and correlate calculation.

16. The method of claim 5, comprising:
    correlating said detected carrier envelope with said amplitude training waveform.

17. A system to synchronize modulation paths in a polar transmitter, comprising:
- an amplifier; and
- an amplitude modulation path coupled to said amplifier to receive an amplitude training waveform; and a phase modulation path coupled to said amplifier to receive a frequency training waveform;
- a detector coupled to said modulation paths, said detector to detect modulated training waveforms; and
- a processor coupled to said detector, said processor to determine a delay between said training waveforms and said modulated training waveforms;
- wherein said detector is to detect a first modulated training waveform associated with said amplitude training waveform and to generate a first envelope waveform and said detector to detect a second modulated waveform associated with said frequency training waveform and generate a second envelope waveform; and
- wherein said processor is to correlate said first envelope waveform with said first amplitude training waveform to determine an amplitude modulation path delay; and said processor is to correlate said second envelope waveform with said frequency training waveform to determine a phase modulation path delay.

18. The system of claim 17, comprising:
- a waveform generator coupled to said amplitude modulation path and to said phase modulation path;
- said waveform generator to generate said baseband amplitude training waveform and said baseband frequency modulation waveform.

19. The system of claim 18, wherein said waveform generator is to couple said baseband amplitude training waveform and said baseband frequency modulation waveform into respective said amplitude modulation path and phase modulation path separately.

20. The system of claim 18, wherein said waveform generator is to couple said baseband amplitude training waveform and said baseband frequency modulation waveform into respective said amplitude modulation path and phase modulation path simultaneously.

* * * * *